(12) United States Patent
Oh et al.

(10) Patent No.: US 8,004,429 B2
(45) Date of Patent: Aug. 23, 2011

(54) DATA COMPRESSION/DECOMPRESSION APPARATUS AND METHOD

(75) Inventors: Sung Jo Oh, Suwon-si (KR); Young Chul Wee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 473 days.

(21) Appl. No.: 12/203,114

(22) Filed: Sep. 2, 2008

(65) Prior Publication Data
US 2009/0070543 A1    Mar. 12, 2009

(30) Foreign Application Priority Data
Sep. 7, 2007    (KR) ........................ 10-2007-0091049

(51) Int. Cl.
*H03M 7/00*    (2006.01)
(52) U.S. Cl. ............................................ 341/50; 341/51
(58) Field of Classification Search .................... 341/50, 341/51; 375/240.16; 345/603; 348/699
See application file for complete search history.

(56) References Cited

U.S. PATENT DOCUMENTS

| | | | | |
|---|---|---|---|---|
| 4,464,650 A | * | 8/1984 | Eastman et al. | 341/51 |
| 5,325,091 A | * | 6/1994 | Kaplan et al. | 341/51 |
| 5,525,982 A | * | 6/1996 | Cheng et al. | 341/51 |
| 5,731,850 A | * | 3/1998 | Maturi et al. | 348/699 |
| 5,995,080 A | * | 11/1999 | Biro et al. | 345/603 |
| 6,492,917 B1 | * | 12/2002 | Goel et al. | 341/60 |
| 2001/0024472 A1 | * | 9/2001 | Sporer et al. | 375/240.16 |
| 2005/0276329 A1 | * | 12/2005 | Adiletta et al. | 375/240.16 |
| 2008/0062775 A1 | * | 3/2008 | Oh | 365/189.05 |

FOREIGN PATENT DOCUMENTS
WO    2006/028156 A1    3/2006
* cited by examiner

*Primary Examiner* — Jean B Jeanglaude
(74) *Attorney, Agent, or Firm* — Jefferson IP Law, LLP

(57) ABSTRACT

A data compression/decompression apparatus and method are provided for improving memory utilization. The data compression/decompression apparatus includes a compressor for calculating costs of domain blocks to a range block through forward searching in a search range, for selecting the domain block having the lowest cost to the range block as a reference domain block through backward searching, for generating distance and difference information of the reference domain block, and for encoding the distance and difference information into compressed data of the range block. The data compression/decompression apparatus also includes a decompressor for finding the reference domain block on the basis of the distance and for decoding the compressed data into original data of the range block with reference to the difference information.

21 Claims, 16 Drawing Sheets

FIG. 3A

Forward Coding Result →

| 10 | 11 | 12 | 13 | 14 | 15 | 16 | 17 | 18 | 19 | 20 | 21 | 22 | 23 | 24 | 25 | 26 | 27 | 28 | 29 | 30 | 31 | 32 | 33 |
|----|----|----|----|----|----|----|----|----|----|----|----|----|----|----|----|----|----|----|----|----|----|----|----|
| A  | B  | D  | F  | B  | C  | E  | F  | A  | B  | B  | C  | A  | B  | E  | F  | B  | C  | D  | E  | A  | A  | C  | B  |

Current coding macro block position (points to block 26)

dist = 4, diff = 0
dist = 8, diff = 0
dist = 6, diff = 0

FIG. 3B

| 10 | 11 | 12 | 13 | 14 | 15 | 16 | 17 | 18 | 19 | 20 | 21 | 22 | 23 | 24 | 25 | 26 | 27 | 28 | 29 | 30 | 31 | 32 | 33 |
|----|----|----|----|----|----|----|----|----|----|----|----|----|----|----|----|----|----|----|----|----|----|----|----|
| A  | B  | D  | F  | B  | C  | E  | F  | A  | B  | B  | C  | A  | B  | E  | F  | B  | C  | D  | E  | A  | A  | C  | B  |

↓ Backward Coding Result dist = 12
diff = 0, DF XOR EF, 0

DATA COMPRESSION/DECOMPRESSION APPARATUS AND METHOD

PRIORITY

This application claims the benefit under 35 U.S.C. §119 (a) of a Korean patent application filed in the Korean Intellectual Property Office on Sep. 7, 2007 and assigned Serial No. 2007-0091049, the entire disclosure of which is hereby incorporated by reference.

BACKGROUND OF THE INVENTION

1. Field of the Invention

The present invention relates to a data compression/decompression apparatus and method. More particularly, the present invention relates to an apparatus and method for improving a memory compression ratio and access speed.

2. Description of the Related Art

Typically, digital data processing systems equipped with memory devices operate with various memory management techniques for efficient memory utilization. One approach is to compress data in a writing mode and to decompress the data for use in a reading mode. In this case, an increase of a compression ratio improves memory utilization, but reduces compression/decompression speed, resulting in an increase of memory access time. In contrast, low compression ratio decreases the memory access time, but the memory utilization is degraded. Accordingly, there is a need to develop a data compression/decompression method that is capable of achieving a high compression ratio without compromising memory access speed.

SUMMARY OF THE INVENTION

An aspect of the present invention is to address at least the above-mentioned problems and/or disadvantages and to provide at least the advantages described below. Accordingly, an aspect of the present invention is to provide a data compression/decompression apparatus and method that is capable of enhancing a compression ratio without compromising memory access speed using a backward coding scheme.

Another aspect of the present invention is to provide a data compression apparatus and method that is capable of enhancing compression ratio by compressing data using a table for storing frequently used data.

Yet another aspect of the present invention is to provide a data compression apparatus and method that is capable of controlling a compression ratio and compression/decompression speed by adjusting an exception handling block in units of macro blocks.

Still another aspect of the present invention is to provide a data compression apparatus and method that is capable of enhancing a compression ratio without compromising a compression/decompression speed by coding data of macro blocks in forward and backward directions and searching for domain blocks having the lowest cost.

A further aspect of the present invention is to provide a data compression apparatus and method that is capable of enhancing a compression ratio by compressing data with reference to tables (global and local tables) storing compressed data represented by distance and difference information between blocks and setting the frequently appeared difference values with low costs during the compression process.

Another aspect of the present invention is to provide a data compression apparatus and method that is capable of controlling compression ratio and decompression speed by performing exception handling on the macro block having a low compression ratio.

In accordance with an aspect of the present invention, a data compression/decompression apparatus is provided. The apparatus includes a compressor for calculating costs of domain blocks to a range block through forward searching in a search range, for selecting the domain block having the lowest cost to the range block as a reference domain block through backward searching, for generating distance and difference information of the reference domain block, and for encoding the distance and difference information into compressed data of the range block, and a decompressor for finding the reference domain block on the basis of the distance and for decoding the compressed data into original data of the range block with reference to the difference information.

In accordance with another aspect of the present invention, a data compression/decompression method is provided. The method includes compressing data by calculating costs of domain blocks to a range block through forward searching in a search range, selecting the domain block having the lowest cost to the range block as a reference domain block through backward searching, generating distance and difference information of the reference domain block, and encoding the distance and difference information into compressed data of the range block and decompressing the compressed data by finding the reference domain block on the basis of the distance and decoding the compressed data into original data of the range block with reference to the difference information.

In accordance with yet another aspect of the present invention, a data processing apparatus of a mobile terminal is provided. The apparatus includes a memory, a compressor for calculating costs of domain blocks to a range block through forward searching in a search range, for selecting the domain block having the least cost to the range block as a reference domain block through backward searching, for generating distance and difference information of the reference domain block, and for encoding the distance and difference information into compressed data of the range block, a decompressor for finding the reference domain block on the basis of the distance and for decoding the compressed data into original data of the range block with reference to the difference information and a controller for storing, in a writing mode, the compressed data output by the compressor within the memory and for reading out, in a reading mode, the compressed data to the decompressor.

Other aspects, advantages, and salient features of the invention will become apparent to those skilled in the art from the following detailed description, which, taken in conjunction with the annexed drawings, discloses exemplary embodiments of the invention.

BRIEF DESCRIPTION OF THE DRAWINGS

The above and other aspects, features and advantages of certain exemplary embodiments of the present invention will be more apparent from the following description taken in conjunction with the accompanying drawings, in which:

FIG. 3A is a diagram illustrating a forward coding procedure of a data compression method according to an exemplary embodiment of the present invention;

FIG. 3B is a diagram illustrating a backward coding procedure of a data compression method according to an exemplary embodiment of the present invention;

Throughout the drawings, it should be noted that like reference numbers are used to depict the same or similar elements, features and structures

DETAILED DESCRIPTION OF EXEMPLARY EMBODIMENTS

Figure 1:
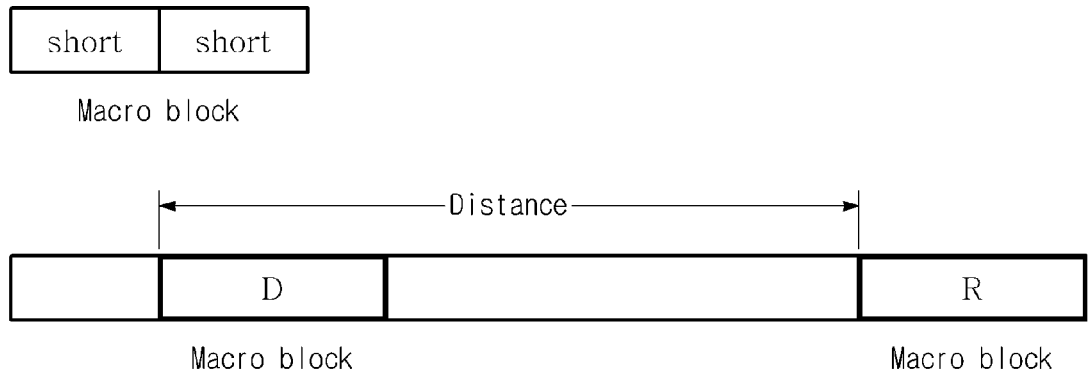
FIG. 1 is a diagram illustrating data structures of a range block and domain block for use in a data compression method according to an exemplary embodiment of the present invention.

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. Also, descriptions of well-known functions and constructions are omitted for clarity and conciseness. In the drawings, certain elements may be exaggerated or omitted or schematically depicted for clarity of the invention.

In the following description, a number of bits of a macro block, numbers of bits and short blocks, distance and difference information, and threshold values of tables are provided to enable a clear and consistent understanding of the detailed description and the claims. However, the numbers used in the description are for example only and are not intended to be limiting. Furthermore unless otherwise noted, terms are to be understood according conventional usage by those skilled in the relevant art.

In the following description, the term "macro block" denotes a unit of data for compression, and the term "short block" is a unit of data constituting the macro block. A macro block may comprise of at least two short blocks. In an exemplary implementation, a short block is 16-bits long. In the following description, it is assumed that a macro block consists of two short blocks for ease of description only and it is to be understood that a macro block may consist of more than two short blocks. The term "range block" refers to a data unit comprising macro blocks that are to be compressed. The term "domain block" refers to a macro block that is referred to for compressing the range block. The term "distance" refers to a distance between the range block and the domain block. The distance information may include a distance value between the range block and domain block and a distance flag indicating whether the distance value is changed. The distance flag may be set for each macro block and indicates a structure of range block. The term "difference" refers to a difference between the range block and the domain block. The difference information may include a difference value between the range block and the domain block and a difference flag indicating whether the difference value exists. The difference may be obtained by performing an exclusive OR (XOR) operation on the range block and the domain block. The term "cost" is used for determining the length of data (number of bits) to be stored within the memory as compressed data by calculating the difference value. The term "exception handling" refers to the use of raw data when the compression ratio is not high enough. The term "global table" refers to a fixed entry table using the difference value as index. The term "local table" refers to a floating entry table using the macro blocks that appear frequently during the compression process as an index. The term "search range" refers to a range for searching for domain blocks at the position of the range block. The term "forward coding" refers to a coding scheme for coding, in the search range, the domain block which encodes, with the least cost, the range block composed of a macro block currently being coded. The term "backward coding" refers to a coding scheme for reducing the cost by restructuring the previously encoded range blocks including the currently coded macro block. In the forward coding, a compressor encodes the range block consisting primarily of a sequentially selected macro block. The backward coding increases the compression ratio by restructuring the previously coded range blocks including a currently encoded macro block. The term "data" includes program data, user data and the like.

In the following description of exemplary embodiments, the compressor determines the length of a range block when compressing data, searches for domain blocks having identical or similar data to the range block, and compresses the data with the distance and difference between the range block and the searched domain block. In an exemplary embodiment, the data is binary data including program code data of firmware and software.

In a memory storage and retrieval system, it is generally preferred that the compressor and decompressor have high compression ratio and high decompression speed. However, as the compression ratio increases, the compression/decompression speed of the compressor is likely to decrease. Exemplary embodiments of the present invention improve both the compression ratio and decompression speed by using the following methods when searching for the domain blocks in the search range.

First, the compressor performs coding with reference to a reference list built during a previous macro block coding in forward and backward directions when comparing the range block with domain blocks in the search range and selects a domain block having the least difference value with the range block in the search range.

Second, the compressor performs compression on the data of the range block using the distance and difference information between the range block and the selected domain block. In an exemplary embodiment of the present invention, a first data compression method includes compressing data using the difference value between two blocks, a second data compression method includes compressing data using frequently appearing difference values that are experimentally measured between two blocks and registered to a table, and a third data compression method includes compressing data using a difference value registered in a floating table while compressing the data using frequently appearing values registered to a fixed table.

The difference value for use in the first method can be an exclusive OR operation value of the range block and domain block having the least difference value. The table for use in the second method is a fixed table that can be used as a global table of the third method.

The compression methods using tables measure the difference values frequently appearing between the range blocks and domain blocks during the compression process and create costs according to the measured difference values. The difference values are used as indexes and values are stored for coding the difference values with the costs at the corresponding index positions. By mapping the most frequently appearing difference values to the least cost, it is possible to improve the compression ratio of the data. In order to further improve the compression ratio, a global table reflecting general frequencies and a local table reflecting local frequencies may be used. The global table is a fixed table which may reside in the compressor or may be stored at a specific region of a memory during the compression process. The local table is a floating table which is generated with the difference values and costs between the range blocks and domain blocks that appear frequently at a specific region but are not listed in the global table. The local table may be stored in the memory. The global table is a fixed table created before starting the compression process and can be applied globally to all data stored in the writing mode. The local table is a floating table that can be used while compressing data at a specific local region.

Third, the compressor performs data compression in units of a macro block. When there is no domain block identical or similar to the range block, the compressor performs exception handling on the data of the range block rather than data compression. That is, when the range block has no identical or similar domain block in the search range (e.g., at least one of multiple short blocks is not identical with the range block), a tolerable compression ratio to the range block is not expected. In this case, the compressor performs exception handling on the range block to store the data of the range block in an uncompressed form. Using the exception handling block, it is possible to improve the compression ratio and decompression speed.

The data compression method according to an exemplary embodiment of the present invention can be implemented with at least one of the above explained data compression models, i.e. the data compression model using the difference value between two block, the data compression model using only the global table, and the data compression model using the global and local tables. Also, the data compression method can use the exception handling function.

In the following exemplary embodiment, it is assumed that the data compression method is implemented with global and local tables and exception handling function. The data compression method of this exemplary embodiment can improve the compression ratio without compromising the high compression speed by coding the data of a macro block in forward and backward directions and searching for the domain block having the lowest cost. Also, the data compression method of this exemplary embodiment stores compressed data within the tables (global and local tables) efficiently such that the difference values appearing frequently during the compression process are assigned the lowest costs, resulting in improvement of data compression ratio. Also, the data compression method of this exemplary embodiment performs exception handling on the macro block of which a compression ratio is assessed to be low so as to adjust the compression ratio and decompression speed.

FIG. 1 is a diagram illustrating data structures of a range block and domain block for use in a data compression method according to an exemplary embodiment of the present invention.

Referring to FIG. 1, a compressor first calculates a distance between a range block R to be compressed and a domain block D, calculates a difference between the range block R and the domain block D by comparing their data with each other (i.e. determines an exclusive OR operation value), and generates compressed data of the range block using the calculated distance and difference values. The range block may comprise more than one macro block, and the size of the domain block can be identical with that of the range block. Furthermore, the macro block can be partitioned into short blocks. In the following description, it is assumed for sake of convenience that a macro block includes two short blocks as shown in FIG. 1, and each short block is 16 bits (2 bytes).

The domain blocks constituting the range block can include macro blocks that are identical in size and located in a preset range (i.e. search range) prior to the range block. The range block cannot be overlapped and is aligned in units of integers. The domain blocks can be overlapped and aligned in units of a short block (in unit of byte with the 8-bit short block and 2 bytes with the 16-bit short block). For example, when the data to be compressed include 5 macro blocks (MB0 to MB4) corresponding to 10 short blocks (SB0 to SB9), the range block is designated in order of sequential short block pairs of SB0-SB1, SB2-SB3, SB4-SB5, . . . , SB8-SB9. In a case that the range block is represented by the short block pairs of SB8-SB9, the domain blocks corresponds to the short block pairs of SB6-SB7, SB5-SB6, SB4-SB5, . . . , SB1-SB2, and SB0-SB1. The compression of the range block is represented by the distance and difference information to the domain blocks. At this time, a domain block having the distance and difference information representing the lowest cost is selected The term distance refers to a distance between the range block and the selected domain block. The distance influences the compression ration because it is used for compressing data of the range blocks. Accordingly, the distance is preferably limited in size, and the value of distance determines the search range. As the length of the range block increases, the number of bits for representing the distance decreases, but the number of bits for representing the distance value increases. For this reason, the length of the range block influences the compression ratio. Accordingly, in order to efficiently compress data, it is required to set the search range and the length of the range block appropriately.

In this exemplary embodiment, the domain block of near optimum solution is searched quickly using the forward and backward coding method when compressing a range block. The cost required for compressing a macro block is set to be the least one and is updated such that the cost of the previously compressed macro blocks including backward macro block has the least value. That is, the data compression method of this exemplary embodiment compresses the data by searching macro blocks in a forward direction in the search range such that the cost becomes lower and then determines the cost of the macro blocks compressed already in a backward direction to adjust the length of the domain block and the distance to the domain block.

Figure 2:
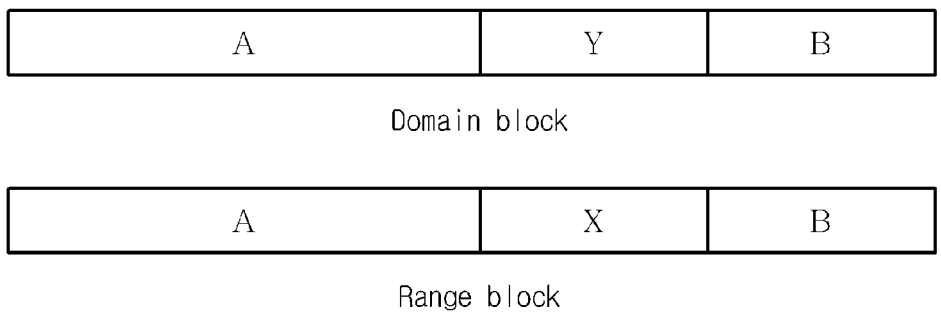
FIG. 2 is a diagram illustrating data structures of a compressed domain block and range block according to an exemplary embodiment of the present invention.

FIG. 2 is a diagram illustrating data structures of a compressed domain block and range block according to an exemplary embodiment of the present invention.

In this exemplary embodiment, a range block of size k is found such that a distance cost and a difference cost to the macro blocks already compressed and currently being compressed are optimized. In the conventional compression methods, the macro blocks that are not identical with the reference block do not belong to the same range block. In this exemplary embodiment, however, even when the macro block is not identical with the domain block, it can be a part of the range block.

In the exemplary implementation shown in FIG. 2, the cost is obtained as T=cost(A,A)+cost(X,Y)+cost(B,B) by partitioning the range block into 3 parts. In this exemplary embodiment, however, the range blocks are processed as a single data unit such that the cost is obtained as U=cost(AXB, AYB). In this case, the cost T has at least two distance values, whereas the cost U has only one distance value. Accordingly, even when X differs from Y, the cost (X,Y) obtained by coding the distance value between X and Y is relatively low, resulting in U>T. As shown in FIG. 2, the macro block X which is not identical with the reference block Y can be a part of the range block.

FIGS. 3A and 3B are diagrams illustrating a method of selecting an optimal domain block to a range block in a search range according to an exemplary embodiment of the present invention. In order to select an optimal domain block, the domain blocks in the search range are coded in forward and backward directions. If a range block is configured, the compressor performs coding on the domain blocks existing in the search range in forward and backward directions and selects a domain block having the least cost. Next, the compressor generates the distance and cost between the selected domain block and the range block as compressed data. FIG. 3A is a diagram illustrating a forward coding procedure of a data compression method according to an exemplary embodiment of the present invention, and FIG. 3B is a diagram illustrating a backward coding procedure of a data compression method according to an exemplary embodiment of the present invention. In FIGS. 3A and 3B, it is assumed that the range block is B,C [26,27] ($26^{th}$ and $27^{th}$ short blocks), and the search range is [10, 11, 12, ..., 25] (from $10^{th}$ to $25^{th}$ short blocks).

Referring to FIGS. 3A and 3B, the forward coding to the range block B,C [26,27] is performed by comparing the domain block that is sequentially selected in the search ranges with the range block B,C [26,27] in units of short blocks. While performing the forward coding, the compressor calculates the distance and difference between the range block and the domain blocks in the search range aligned prior to the range block. Next, the compressor analyzes the distance and difference values while performing the backward coding and selects a domain block having the closest distance and the lowest difference to the range block. In FIGS. 3A and 3B, the compressor selects the domain block B,C [20,21] which is closest in distance and least in difference to the range block B,C [26,27] through the forward and backward coding. Although the domain block B,C [14,15] has the same cost as the domain block B,C [20,21] in difference, its distance cost is greater than that of the domain block B,C [20,21]. Accordingly, the compressor selects the domain block B,C [20,21] and records the distance and difference information. In this manner, the compressor selects the domain block A,B[18,19] to the range block A,B [22,23] with distance value of 4 and difference value of 0, the domain block E,F [16,17] to the range block E,F [24,25] with distance value of 8 and difference value of 0, and the domain block B,C [20,21] to the range block B,C [26,27] with distance value 6 and difference value 0.

During the backward coding, the searching is performed by group of macro blocks. For example, the backward coding to the range block B,C [26,27] can be done to the pair of range block A,B,E,F,B,C [22:27]—domain block A,B,D,F,B,C [10:15] with a single distance value. Since this group coding has lower cost than the cost of the distance values of coding to the domain block B,C [20:21]—range block B,C [26:27], domain block E,F [16:17]—range block E,F [24:25], and domain block A,B [18:19]—range block [22:23], the previous coding result is restructured for improving the compression ratio. Here, although the difference cost of the single distance-based coding is larger than that of the three distance-based coding due to the different data (F[25], E[24], and D[12]), the total cost decreases since it uses less distance values by as much as 2. In this case, the compressor compares the range block A,B,E,F,B,C [22:27] with the domain block A,B,D,F,B,C [10:15] and encodes the range block with distance value of 12 and difference values of 0, DF XOR EF, and 0.

Figure 4:
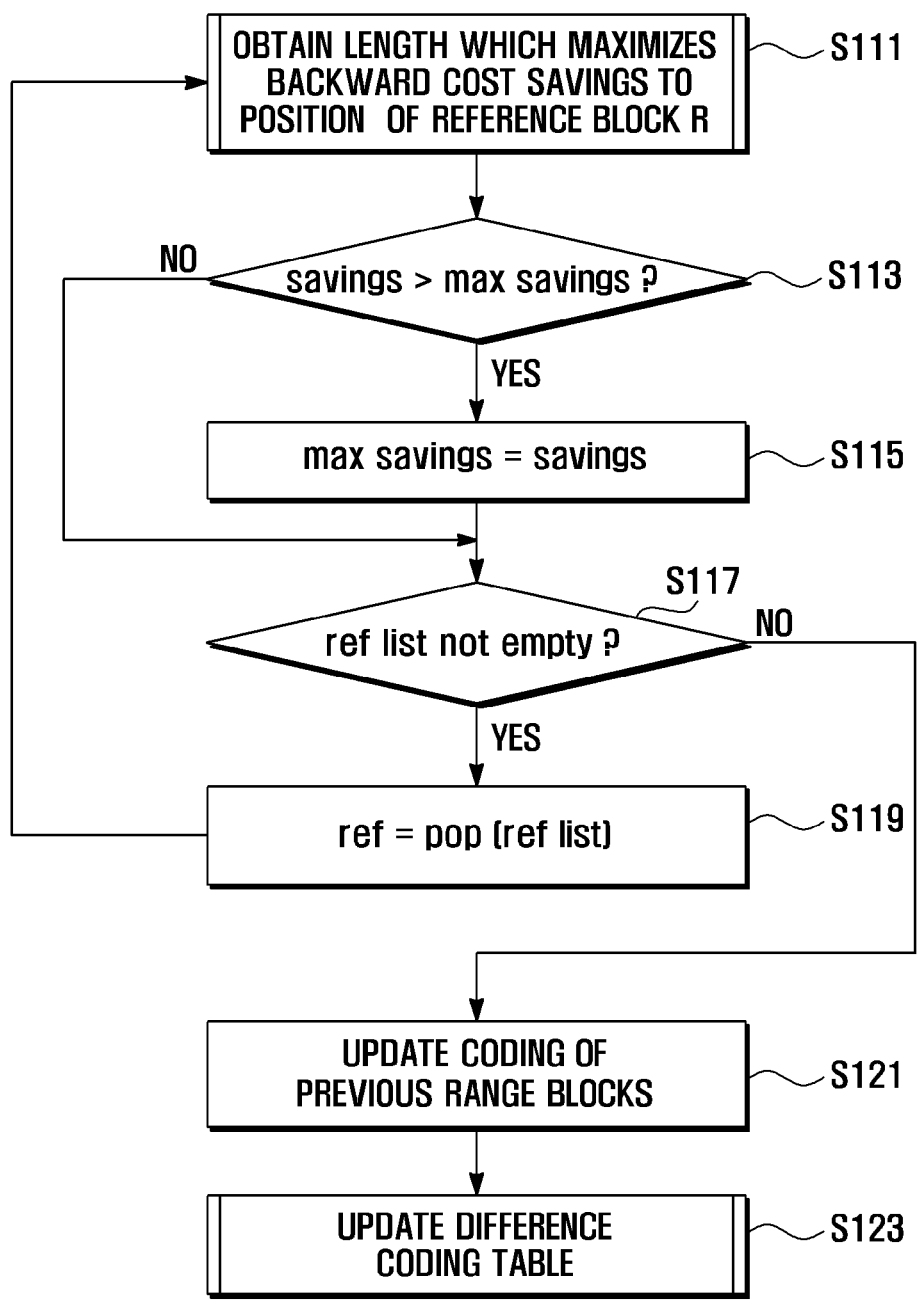
FIG. 4 is a flowchart illustrating a range block encoding in a data compression method according to an exemplary embodiment of the present invention.

FIG. 4 is a flowchart illustrating a range block encoding of a data compression method according to an exemplary embodiment of the present invention. As will be explained in more detail, the compressor first calculates a length which maximizes a backward cost savings at a reference block position of the range block R in a backward direction, and updates the optimum length and information on the reference block if the savings is greater than a maximum savings. Here, the savings refers to the sum of cost savings of the range blocks in length. Next, the compressor updates coding of the blocks to the optimum reference block and optimum length. Next, the compressor creates a local table for optimizing the distance coding by a preset range, and the local table is compressed with reference to the global table and then stored.

Referring to FIG. 4, the compressor calculates a length which maximizes the backward cost saving to a reference block position of a preset range block in step S111.

Figure 5:
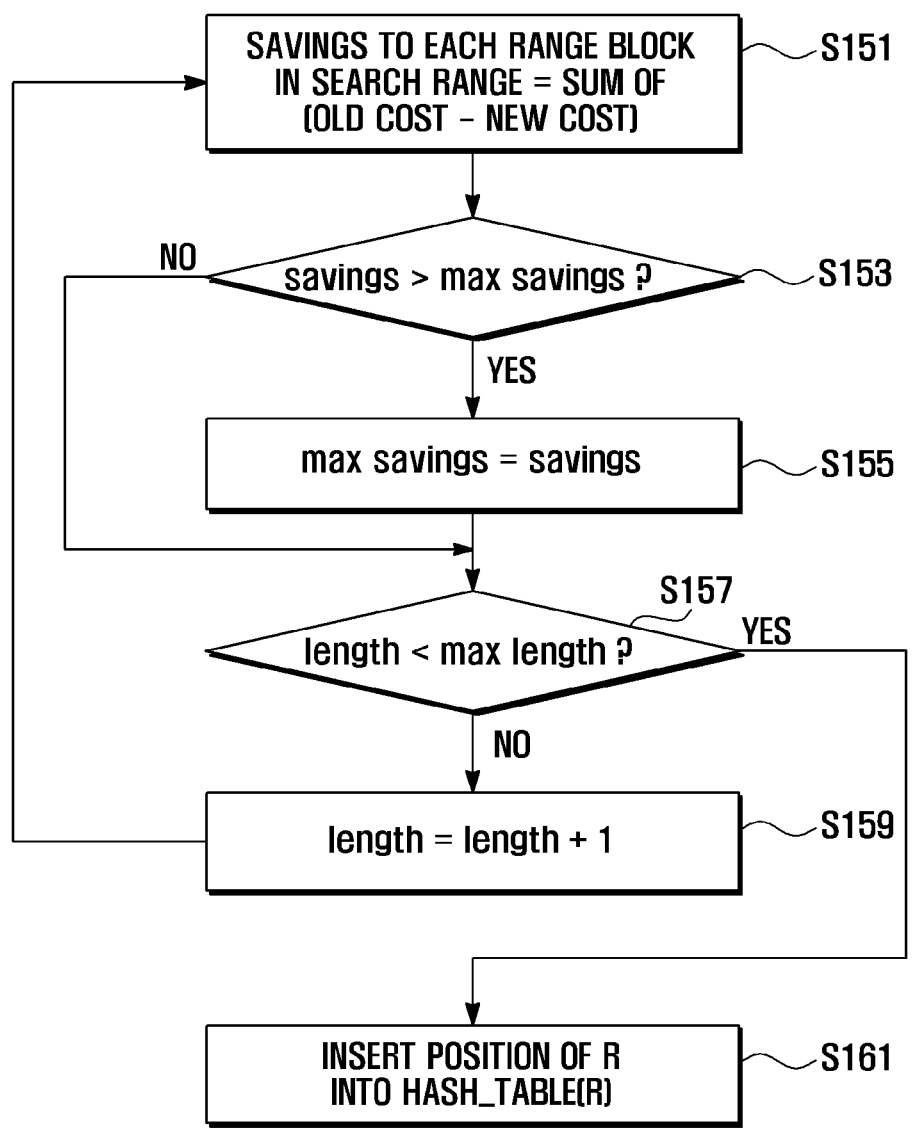
FIG. 5 is a flowchart illustrating an exemplary optimization procedure of FIG. 4 in more detail.

FIG. 5 is a flowchart illustrating an exemplary optimization procedure of step S111 of FIG. 4 in more detail.

Referring to FIG. 5, the compressor calculates a savings value to respective range blocks in the range, i.e., sum of cost (savings=old cost−new cost) in step S151. After obtaining the savings value, the compressor determines whether the savings value is greater than a maximum savings value in step S153. If the savings value is not greater than the maximum savings value, the compressor performs step S157 while maintaining the previous values. Otherwise, if the savings value is greater than the maximum savings value, the compressor updates the maximum savings value with the calculated savings value in step S155. At this time, the compressor also updates the optimum length to the length set at step S151 and the reference block as set at step S151. Next, the compressor determines whether the length is greater than a maximum length in step S157. If the length is not greater than the maximum length, the compressor increments the length by 1 and repeats step S151. Otherwise, if the length is greater than the maximum length, the compressor adds the position of the range block to a hash table in step S161.

Returning to FIG. 4, after the optimum length is obtained, the compressor determines whether the savings value is greater than a maximum savings value in step S113. If the savings value is not greater than the calculated savings value, the compressor maintains the preset values. Otherwise, if the savings value is greater than the maximum savings value, the compressor updates the maximum savings value to the calculated savings value in step S115. At this time, the compressor also updates the optimum length and changes the optimum reference block. Next, the compressor determines whether the reference block exists in the reference list in step S117. If the reference block exists in the reference list, the compressor performs step S119. Otherwise, if the reference block does not exist in the reference list, the compressor updates the coding of the previous range blocks to the optimum reference block and optimum length in step S121. The reference list is registered to a queue in unit of short block (16 bits) for fast search to range blocks afterward. The search targets to a macro block are the positions at which at least one of two short blocks is identical.

Next, the compressor updates a difference coding table in step S123.

Figure 6:
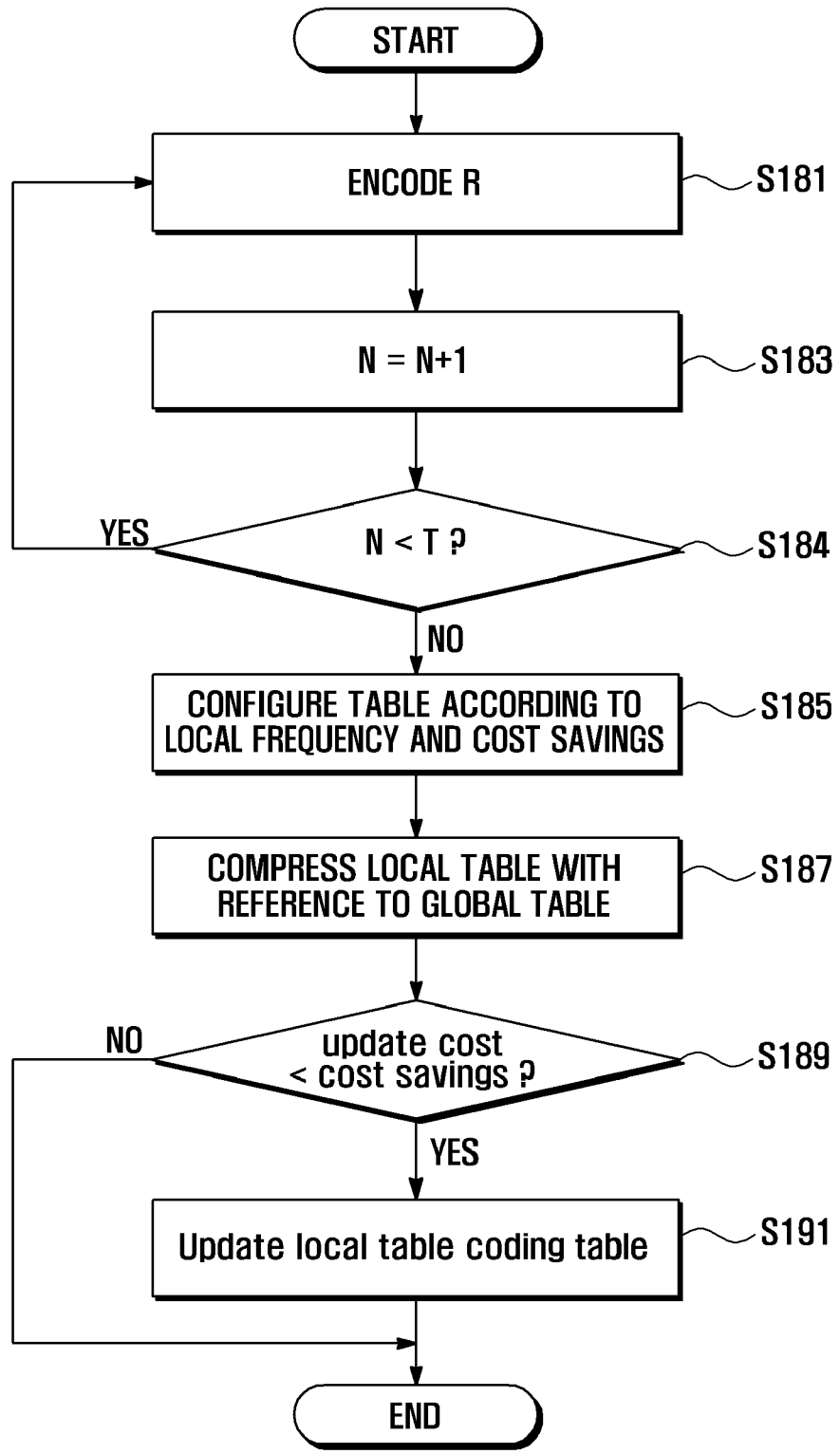
FIG. 6 is a flowchart illustrating an exemplary difference coding table update procedure of FIG. 4 in more detail.

FIG. 6 is a flowchart illustrating an exemplary difference coding table update procedure in step S123 of FIG. 4 in more detail.

Referring to FIG. 6, the compressor encodes a specific range block R in step S181, and then increments the number of times that the range block R has been processed by 1 (N=N+1) in step S183. The initial value of N is 0. Next, the compressor determines whether N is less than a threshold value T in step S184. If N is less than T, the compressor repeats step S181. Otherwise, if N is not less than T, the compressor builds a local table according to a local frequency and cost saving value in step S185. Next, the compressor compresses the local table with reference to the global table in step S187 and determines whether the update cost is less than the cost saving value in step S189. If the update cost is less than the cost savings value, the compressor updates the coding table of the local table in step S191.

The local table created as above is used for compressing the data of the range blocks together with the global table.

Figure 7A:
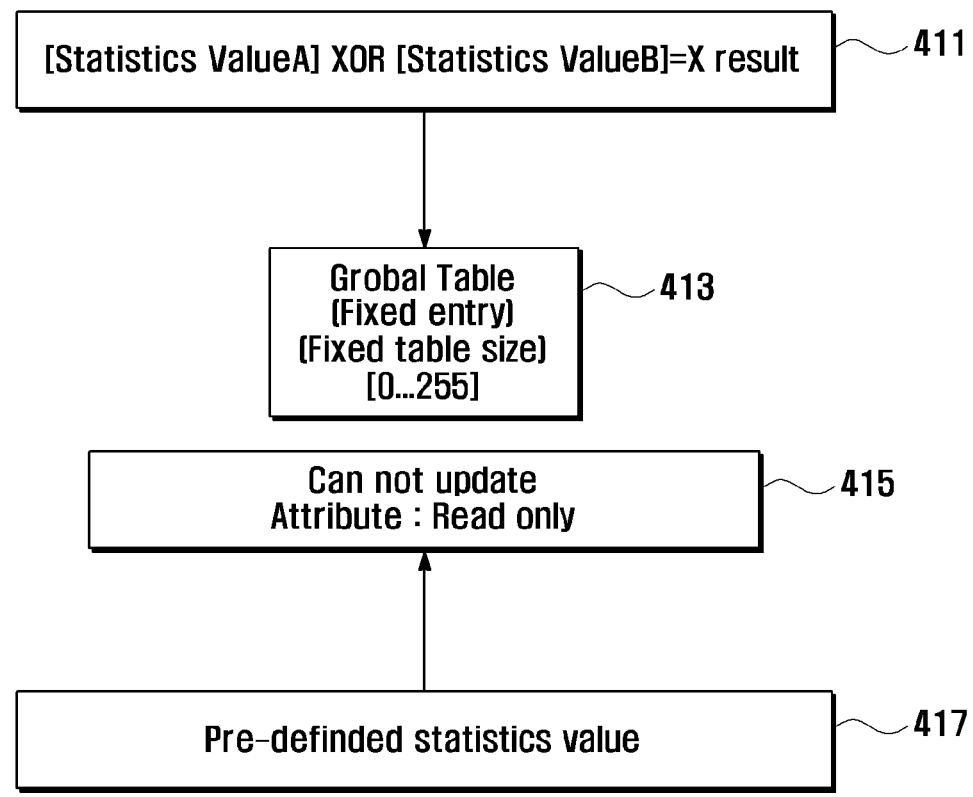
FIG. 7A is a diagram illustrating characteristics of a global table according to an exemplary embodiment of the present invention.
Figure 7B:
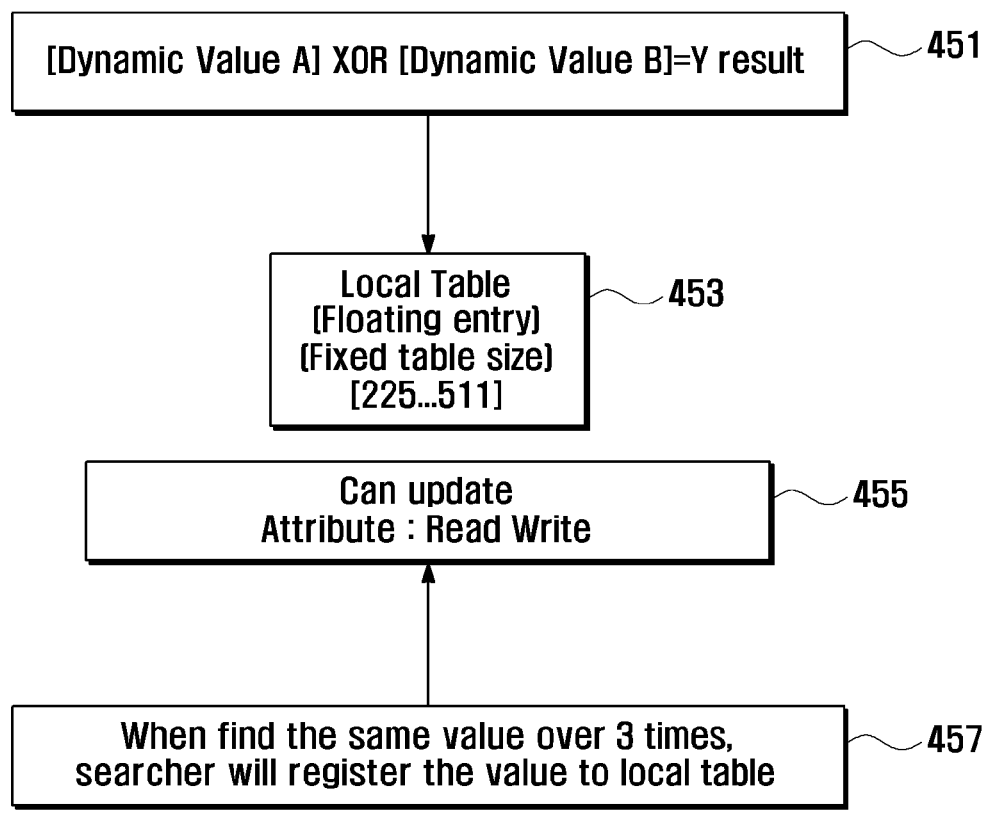
FIG. 7B is a diagram illustrating characteristics of a local table generation according to an exemplary embodiment.

FIG. 7A is a diagram illustrating characteristics of a global table according to an exemplary embodiment of the present invention, and FIG. 7B is a diagram illustrating characteristics of a local table generation according to an exemplary embodiment.

Referring to FIG. 7A, the global table 413 includes predefined statistics values 417. That is, the global table 413 stores the values that frequently appear during the data compression process. The global table is not updated 415 and can be read only in the data compression process. The global table 413 is a fixed table having a fixed size. In this exemplary embodiment, it is assumed that the index of the global table 413 has a value [0, ..., 255] less than 8 bits. The index of the global table can be selected from 0 to 255. The data 411 indicated by an index can be an XOR operation value of the range block and domain block (x result=[statistics value A] XOR [statistics value B]). Accordingly, when using the global table as shown in FIG. 7A, the compressor assigns the indexes of 0, 1, 2, 3, ..., 255 to the frequently appearing difference values between two macro blocks so as to improve the compression efficiency.

Referring to FIG. 7B, the local table 453 is created while compressing data. In this exemplary embodiment, when a value appears more than 3 times and the value is not registered to the global table, the value 457 is registered to the local table 453. The local table 453 can be created by a searcher of the compressor. The local table 453 can be updated and allows reading and writing data while compressing data 455. The local table 453 allows floating entry and is configured larger than the global table in size. In this exemplary embodiment, it is assumed that the size of local table is 8 bits [256, ..., 511]. In this case, the index of the local table is selected in the range of 256 to 611, and the data 451 represented by the index can be an XOR operation value of the range block and domain block (y result=[dynamic value A] XOR [dynamic value B]. That is, the local table 453 as shown in FIG. 7B is created while the compressor compresses the data, and the index is assigned to difference values in an order of 256, 257, ..., 511.

Now, the characteristics of the compressor are described in an order of the compression structure, backward cost saving, difference coding, distance coding, and decoding speed control.

Regarding the compression structure, each macro block is composed of two short blocks, and each short block is 16 bit long. The domain blocks belonging to the range block can be the blocks existing before the range block in the search range. Range blocks are not overlapped with each other and are aligned in units of integers. Domain blocks can be overlapped with each other and are aligned in units of bytes. The compression of a range block is represented by the distance and difference with domain blocks.

Regarding the backward cost savings, the reference list of macro blocks is composed of positions at which at least one short block is identical with the short block of the macro block and stored in a hash table while the prior macro blocks are compressed. With the same distance value, the length k is obtained so as to maximize the current cost. Here, the term savings refers to the sum of cost savings at k range blocks. Afterward, the compression of the range blocks is updated to the optimum reference and optimum length. That is, the compressor performs an optimization process through steps S111 to S121 of FIG. 4. In more detail, the compressor calculates the sum of savings (savings=old cost−new cost) to the range blocks in length. Next, the compressor determines whether the current savings value is greater than the maximum saving value (savings>max savings) and updates, if the current savings value is greater than the maximum saving value, the maximum savings value to the current savings value. At this time, if the length is less than the maximum length, the compressor increments the length by 1 and repeats the above steps. Otherwise, if the length is equal to the maximum length, the compressor adds the position of the range block to the hash table (hash table, (R)).

Regarding the difference coding, the values obtained through XOR operations in units of short blocks are coded. The coding method can be selected according to the required decompression speed. The global table is an entropy coding table which is efficient for compressing global frequency. The local table is stored after being compressed with reference to the global table. The update of table entries of the local table is determined in consideration of table compression ratio and difference coding cost.

Regarding distance coding, one of two distance coding methods can be selected in consideration of decompression speed and compression ratio. One distance coding method expresses the sameness of the current range block to a previous range block with 1 bit when the distance of the current range block is identical with the distance of the previous range block, expresses the difference of the current range block from the previous range block with 10 bits when the distance of the current block differs from the distance of the previous range block and is less than 256, and expresses 18 bits in other cases. The other distance coding method expresses the distance with 16 bits in every case and compresses the distance sequence to store separately. In this exemplary embodiment, the first distance coding method is used.

Regarding decoding speed control, a Large Macro Block (LMB) is composed of m macro blocks. If the compression cost of LMB is greater than the threshold value t, the LMB is stored without compression. The LMB is called an exception handling block. Since the decompression process of the exception handling block is very simple, the compression speed is improved. The decompression speed can be controlled by adjusting the threshold value t.

The data compressor according to this exemplary embodiment of the present invention is characterized as follows. When compressing a macro block, the compressor controls the number of partitions of the range block so as to improve the compression ratio of the macro block. Also, the compressor finds a position at which the previously compressed cost saving is maximized rather than minimizing the cost directly so as to reduce the compression time. This is because the direct minimization of the cost alters the length of the range block and thus increase time complexity. Also, the macro block is composed of multiple short blocks (in this exemplary embodiment, two short blocks), and the compressor performs hashing on the position at which at least one short block of the range block is identical during the compression process so as to secure the continuity of the range blocks while improving the compression speed. Finally, the compressor stores the global and local tables in the compressed format and compresses the data of macro blocks using the tables.

The structure and operation of the compressor characterized as above is described hereinafter.

Figure 8:
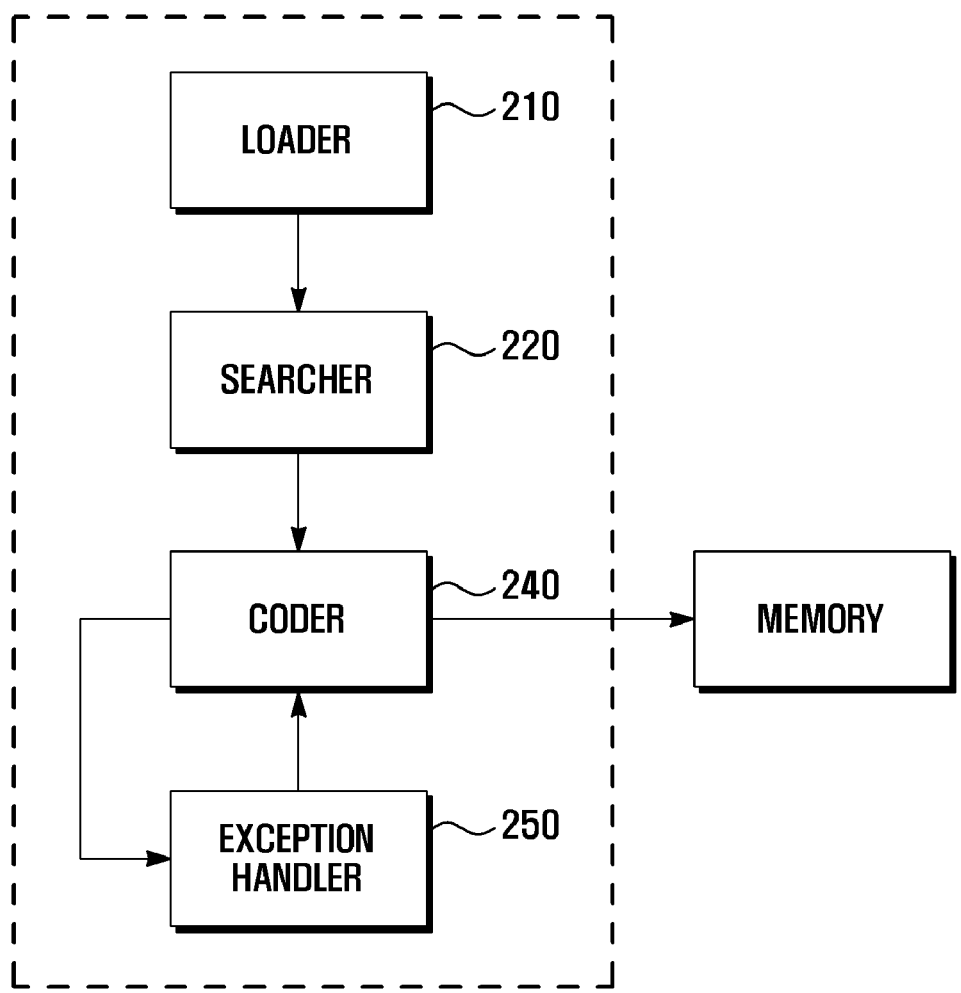
FIG. 8 is a block diagram illustrating a configuration of a compressor according to an exemplary embodiment of the present invention.

FIG. 8 is a block diagram illustrating a configuration of a compressor according to an exemplary embodiment of the present invention.

Referring to FIG. 8, the compressor includes a loader 210, a searcher 220, a coder 240, and an exception handler 250. The loader 210 first loads the raw binary data input to the compressor. Here, the loader 210 loads the data in unit of coding frame which is a data size suited for the coder 240. The term "coding frame" denotes the size of data unit to be compressed by the coder 240 (or the size of search range determined by the searcher). A buffer may be provided for buffering the data of a coding frame loaded by the loader 210.

The searcher 220 determines the search range on the basis of the data of the loaded coding frame, checks a range block, generates difference values between the range block and domain blocks positioned in the range of the search range, calculates costs according to the difference values, and determines distance information and cost value to the domain block having the least cost. At this time, the searcher 220 calculates the costs between the range block having the size of the macro block and the domain blocks positioned in the search range through forward coding, and determines the length and distance of the range block which optimizes the cost including the previously coded range blocks and the macro block through backward coding. After calculating the difference between the range block and domain block, the searcher 220 creates, if the range block and domain block are identical with each other, distance information indicating the identification together with distance information to the domain block and, otherwise, indicating the difference together with distance information to the domain block. The difference information may include a difference flag indicating the identification or difference of the two blocks and distance value between the two blocks. The difference value can be used directly (e.g. the XOR operation value), or replaced with the cost value obtained from the difference value or modified cost value. In this exemplary embodiment, the difference value is obtained by calculating the cost using the comparison result value and converting the cost into the index of a table. In this case, the searcher 220 may be provided with a cost table. The cost table is for storing the indexes corresponding to the calculated costs. The table can be a global table or a local table. The difference values are stored with the corresponding indexes in the table. The searcher 220 generates the difference values by comparing the range block and the selected domain block while performing the forward coding in the search range and calculates the cost corresponding to the difference value in the cost table. The searcher 220 compares the currently generated cost with the reference costs so as to update the reference cost when the currently calculated cost is less than the reference cost and, otherwise, maintains the reference cost. By repeating the above process, the searcher 220 searches for the least cost and selects an index corresponding to the least cost from the cost table. Next, the searcher 220 transfers the distance information of the domain block and index corresponding to the selected cost to the coder 240 and repeats the above process for selecting the next range block.

The coder 240 may be provided with a global table and/or a local table. Also, the global table and local table can be buffered in the buffer. The global table is a fixed table as described with reference to FIG. 7A and built with the experimentally measured statistics values. The local table is a variable table as described with reference to FIG. 7B and built in association with the data being compressed currently. The global and local tables have indexes corresponding to the costs and store the difference values between the range block and domain blocks in association with the indexes. In the following description, it is assumed that both the global and local tables are used. However, the data compression can be done with only one of the global and local tables. The coder 240 processes the index linked to the cost value in the table as the coding data of the range block. Here, the cost may be calculated by the searcher 220. The searcher 220 can calculate the cost on the basis of the different information between the range block and the domain block and access the table index in the cost table using the cost. The index can be of the global table and/or the local table. The searcher 220 transfers the distance information (distance flag and distance value) between the range block and the domain block and the difference information including the index to the coder 240. The coder 240 encodes the distance information and difference information into the compression data.

The operations of the searcher 220 and coder 240 are described hereinafter in more detail. The searcher 220 analyzes the difference between the range block and domain block and calculates cost from the distance. If the difference value between the range block and domain block is 0, i.e. the two blocks are identical with each other, the cost value becomes 0 (or very small cost value). If at least one of the short blocks of the domain block is identical with a short block of the range block, the cost of the identical short block becomes 0, and the cost of the different short block is calculated with the difference value of the two blocks. In this manner, the searcher 220 selects the domain block composed of short blocks having the least cost while comparing the data of the short blocks of the range block and the data of the short blocks of the domain block positioned in the search range. At this time, the searcher 220 calculates costs while searching for the domain blocks in a forward direction in the search range, compares the current cost with the least reference cost while searching for the currently calculated costs in the backward direction, and update the distance information and cost to the current domain block if the currently searched cost is less than the least reference cost. When the domain block search is terminated, the searcher 220 stores the distance information and cost value of the domain black between the range block and the domain block having the least cost. Next, the searcher 220 retrieves indexes corresponding to the costs in the cost table and transfers the distance information and the difference information including the indexes to the coder 240. At this time, the difference information may include the difference flag and the table index. In a case that the range block and the domain block are identical with each other, the table index is excluded. In this exemplary embodiment, when generating the difference information, the searcher 220 resets the difference flag to 0 if the range block and domain block are identical with each other and generates the difference information having only the difference flag. On the other hand, if the range block and domain block are different from each other, the searcher 220 sets the difference flag to 1 and generates the difference information including the table index information selected by the cost corresponding to the difference value.

The coder 240 analyzes the difference flag contained in the difference information so as to determine whether the two blocks are identical with each other in data. If it is determined that the data of the two blocks are identical with each other, the coder 240 encodes the distance information and the difference flag into the compressed data of the range block. Here, the difference information may include the table index. In a case that the table index is included, the coder 240 determines the difference value between the two blocks in the table (global table and/or local table) indicated by the table index, and encodes the distance information and different information into the compressed data of the range block if the difference value is a normal difference value (i.e. identical with the difference value searched by the searcher 220).

The compressor includes an exception handler 250. In this exemplary embodiment, an exception block is a block which is not expected to be compressed efficiently since the difference between the range block and the domain block is greater than a threshold value. For example, in a case that the range block and domain blocks are composed in units of macro blocks consisting of two short blocks as shown in FIG. 1, the searcher 220 determines a range block to be compressed and selects a domain block of which difference (i.e. the cost) to the range block, obtained through the forward and backward coding in the search range, is lowest. However, if the data of the short blocks of the range blocks and the data of the short blocks of the selected domain block differ from each other (i.e. the short blocks of the range block and the domain blocks are entirely different from each other), the compression ratio decreases significantly. In this case, the compressor stores the data of the range block without compression (no coding) and generates a flag indicating the exception block. When decompressing the data stored in the compressed format, the data of the exception block is recovered without a decompression process, resulting in improvement of decoding speed. In another exemplary embodiment, the coder 240 is provided with both the global and local tables and uses the difference flag of 2 bits to be used for indicating an exception flag. In this case, the value of the difference flag can be defined as shown in table 1.

TABLE 1

| Different flag | Description |
| --- | --- |
| 0 | The data of range block and domain block are identical with each other. |
| 01 | The data of range block and domain block differ from each other, and the index is of global table. |
| 10 | The data of range block and domain block differ from each other, and the index is of local table. |
| 11 | The data of range block and domain block differ from each other, and the index does not belong to any of global and local table. (i.e. data of exception block) |

The searcher 220 searches for the domain blocks in the forward and backward direction in the search range to select a domain block of which cost to the range block is lowest. If the data of the selected domain block is identical with the data of the range block, the searcher 220 generates distance information to the selected domain block and difference flag (difference flag=00) indicating that the two blocks are identical with each other and sends the distance information and the difference flag to the coder 240. If the data of the selected domain block differs from the data of the range block and the cost obtained from the difference value between the two blocks is of the global table, the searcher 220 generates distance information to the selected domain block and difference information including a difference flag (difference flag=01) indicating that the cost exists in the global table and a global table index and sends the distance information and difference information to the coder 240. If the data of the selected domain block differs from the data of the range block and the cost obtained from the difference value between the two blocks is of the local table, the searcher 220 generates distance information to the selected domain block and difference information including a difference flag (difference flag=10) indicating that the cost exists in the local table and a local table index and sends the distance information and difference information to the coder 240. If the data of the selected domain block differs from the data of the range block and cost obtained from the difference value between the two blocks is of both the global and local tables, the searcher 220 sets the difference flag as the exception flag and sends the exception flag to the coder 240.

The coder 240 analyzes the difference flag and encodes the data of the range block according to the value of the difference flag. If the difference flag indicates the identification of the two blocks (difference flag=00), the coder 240 encodes the distance information and difference flag to the selected domain block into the compressed data of the range block. If the difference flag indicates the global table index (difference flag=01), the coder 240 encodes the distance information to the selected domain block and the difference information including the difference flag and global table index into the compressed data of the range block. If the difference flag indicates the local table index (difference flag=10), the coder 240 encodes the distance information to the selected domain block and the difference information including the difference flag and the local table index into the compressed data of the range block. If the difference flag indicates the exception flag (difference flag=11), the coder 240 activates the exception handler 250 to store the data of the range block as it is without encoding. In this case, the uncompressed data of the range block is stored in the memory, and the difference flag is stored as the exception flag. Although the exception handler 250 is depicted as an independent component in this exemplary embodiment, it can be integrated into the coder 240.

Figure 9:
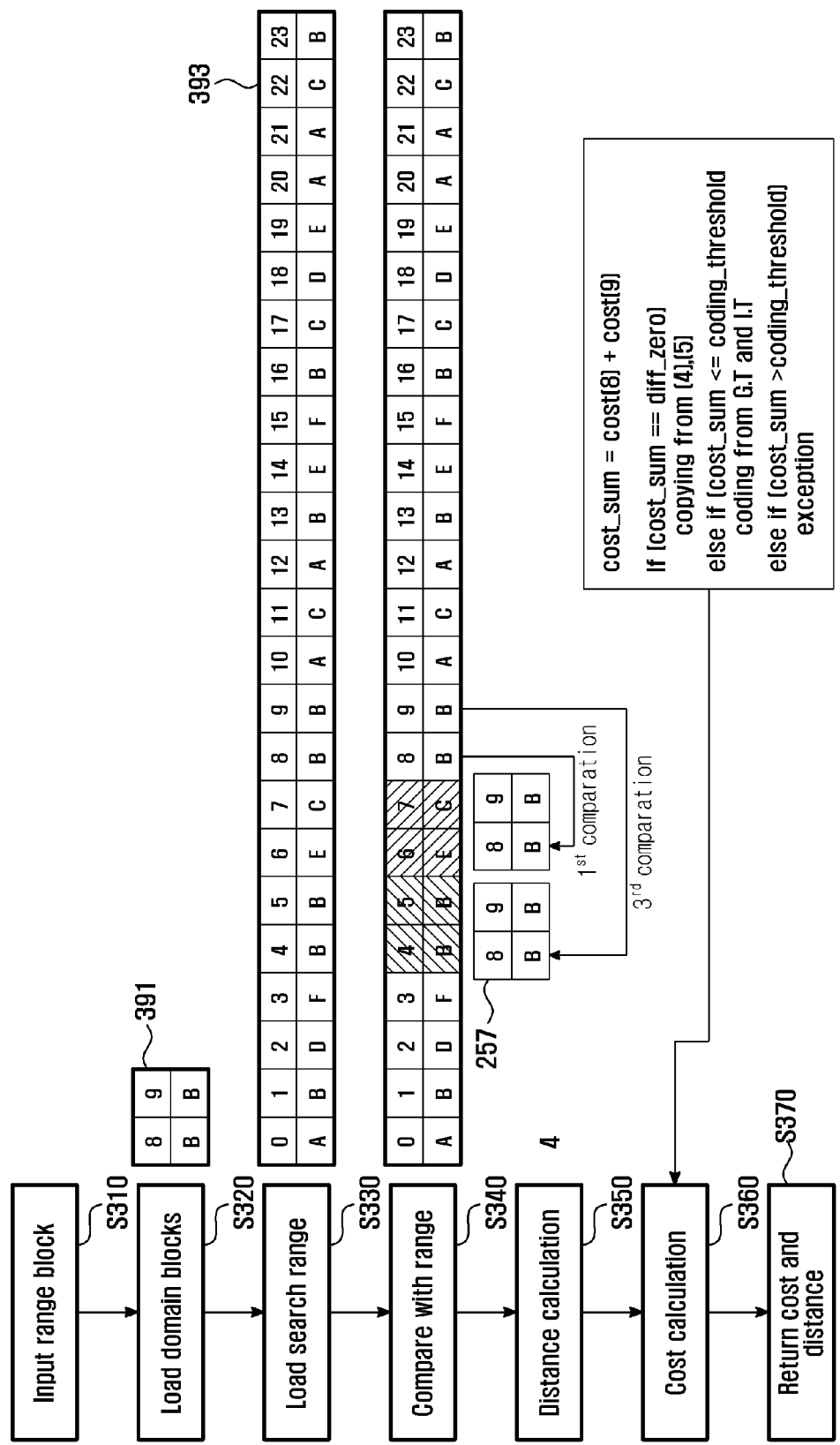
FIG. 9 is a diagram illustrating an exemplary operation of the searcher of FIG. 8.

FIG. 9 is a diagram illustrating an exemplary operation of the searcher 220 of FIG. 8. In this exemplary embodiment, the operation of the searcher 220 is described in association with the range block consisting of the $8^{th}$ and $9^{th}$ short blocks, referred to as reference numeral 391. In this case, a domain block is represented by two short blocks. In FIG. 9, the domain blocks are represented by pairs of short blocks, i.e. $6^{th}$ and $7^{th}$ short blocks, $5^{th}$ and $6^{th}$ short blocks, $4^{th}$ and $5^{th}$ short blocks, $3^{rd}$ and $4^{th}$ short blocks, $2^{nd}$ and $3^{rd}$ short blocks, $1^{st}$ and $2^{nd}$ short blocks, and $0^{th}$ and $1^{st}$ short blocks. Also, the input data referred to as reference numeral 393 is buffered in a buffer so as to be compressed.

Referring to FIG. 9, the searcher 220 loads a search range in step S310. Here, the search range can be set to 2, 4, 8, 16, ..., 65536 macro blocks. The search range can be the data unit (coding frame) by which the coder 240 encodes the data. After determination of the search range, the searcher 220 loads a range block to be coded in step S320. In FIG. 9, the range block is of the $8^{th}$ and $9^{th}$ short blocks. Next, the searcher 220 selects domain blocks, in the search range, to be compared with the range block in step S330. The domain block is selected while performing forward coding from the position of the range block. At this time, the domain block can be selected while moving in units of short blocks. After selecting the domain block, the searcher 220 compares the data of the range block with the data of the selected domain block in step S340. The data comparison is performed through XOR operation. Next, the searcher 220 obtains distance information to the domain block in step S350 and calculates a cost using a difference value between the two blocks in step S360. The distance information may include a distance flag and a distance value. The cost is acquired from the difference between the two blocks. The searcher 220 is provided with a cost table storing table indexes, and the cost is used as the address of the cost table in step S370. Accordingly, if the cost is acquired, the searcher 220 generates a value of the cost table stored at the address corresponding to the cost. At this time, the value of the cost table becomes the table index. Here, the table index can be a global table index or a local table index.

While performing the above-described steps, the searcher 220 collects the distance information and costs to the domain blocks in the search range and finds a table index by searching the calculated cost in the cost table. At this time, the searcher 220 selects a table index having the lowest value among the table indexes searched by the cost. That is, the searcher calculates the distance and cost to the domain blocks while performing the forward coding (i.e. calculates distances and costs of the sequentially selected domain blocks to the range block) and determines the table index from the cost table using the costs. Next, the searcher 220 compares the currently selected table index with the table index having the least value among the previously stored table indexes while performing backward coding and maintains a previous index if it is less than the currently selected table index and otherwise, updates the table index value. That is, if the current table index is less than the pre-stored table index, the searcher 220 updates the table index according to the distance and difference value to the currently searched domain block and, otherwise, maintains the pre-stored distance information and table index. While repeating the above-described process, the searcher 220 stores the distance information and table index to the domain block having the least cost in the search range.

In a case that any of the short blocks constituting the range block is not identical with any of short blocks in the search range, the compression efficiency to the range blocks is not sufficient. In this case, the range block is handled as an exception block. That is, when the searcher 220 does not find a required number of short blocks while comparing the short blocks of the range blocks with the short blocks of the domain blocks in the search range, it generates the exception flag without calculating the cost of the range block. For example, in a case that a macro block, which is identical with the range block and domain block in size, is composed of N short blocks, the range block is compared with the domain blocks in the search range, and the number of short blocks identical with each other between the two macro blocks is less than M, the searcher 220 sets the range block as an exception block. In this case, the searcher 220 sets the exception flag for the exception block. In this exemplary embodiment, the difference flag is set to be used as the exception flag (different flag=11 in table 1) without generating a table index.

In this exemplary embodiment, each of range and domain blocks is composed of two short blocks. Here, N is set to 2, and M is set to 0. In a case that the short blocks of the range block and any of short blocks of domain blocks in the search range, the searcher 220 regards the range block as an exception block and thus sets the difference flag to 11.

The searcher 220 may generate a local table. That is, if a difference value (difference value between the range block and domain block), which is not registered in the global table, appears frequently such that the number of appearances is greater than a preset number (here, 3), the searcher 220 registers the difference value to the local table as shown in FIG. 7B. At this time, the cost (table index) of the local table is set to a value greater than the cost (table index) of the global table. Next, the cost and table index are registered to the cost table. In the case that the local table is used, the compressor registers the difference value to the local table, even though not registered to the global table, to improve the compression efficiency.

After the searching process has completed, the searcher 220 transfers the distance information and difference information (which may includes a table index) to the coder 240.

In FIG. 9, the searcher 220 defines the macro blocks from the buffered data 393 and assigns index numbers to the domain blocks prior to the current range block of $8^{th}$ and $9^{th}$ short blocks so as to define the domain blocks of short block pairs, i.e. $6^{th}$ and $7^{th}$ short blocks, $5^{th}$ and $6^{th}$ short blocks, $4^{th}$ and $5^{th}$ short blocks, $3^{rd}$ and $4^{th}$ short blocks, $2^{nd}$ and $3^{rd}$ short blocks, $1^{st}$ and $2^{nd}$ short blocks, and $0^{th}$ and $1^{st}$ short blocks. The searcher 220 compares the data of the range block with the data of sequentially selected domain block and outputs the comparison result. In this case, the searcher 220 generates a difference value between the range block and domain block. Here, the searcher 220 generates E XOR B and C XOR B at the time when the $6^{th}$ and $7^{th}$ short blocks are selected as a domain block, B XOR B and E XOR B at the time when the $5^{th}$ and $6^{th}$ short blocks are selected as a domain block, B XOR B and B XOR B at the time when the $4^{th}$ and $5^{th}$ short blocks are selected as a domain block, F XOR B and B XOR B at the time when the $3^{rd}$ and $4^{th}$ short blocks are selected as a domain block, D XOR B and F XOR B at the time when the $2^{nd}$ and $3^{rd}$ short blocks are selected as a domain block, B XOR B and D XOR B at the time when the $1^{st}$ and $2^{nd}$ short blocks are selected as a domain block, and A XOR B and B XOR B at the time when the $0^{th}$ and $1^{st}$ short blocks are selected as a domain block. The searcher 220 also generates the distance information between the range block and domain blocks.

Next, the searcher 220 calculates cost on the basis of the difference values. If the domain block is identical with the range block ($4^{th}$ and $5^{th}$ short blocks in FIG. 9), the cost is obtained as 0. If one of two short blocks is identical ($5^{th}$ and $6^{th}$ short blocks, $3^{rd}$ and $4^{th}$ short blocks, $1^{st}$ and $2^{nd}$ short blocks, and $0^{th}$ and $1^{st}$ short blocks in FIG. 9), the cost is obtained as the least cost. If both of the two short blocks of the range block are different from corresponding short blocks of the domain block, the cost is obtained as a high cost. In the exemplary case of FIG. 9, the searcher 220 transfers the distance information to the $4^{th}$ and $5^{th}$ short blocks (distance flag=1, distance value=4) and the difference flag (diff flag=0) indicating the identification of the two block data to the coder. 240. In a case that there is no domain block of which cost is 0 (or close to 0) as the $4^{th}$ and $5^{th}$ short blocks, the searcher 220 generates distance and difference information of the domain block having the least cost and transfers the distance and difference information to the coder 240. Here, the distance information may include the difference flag (diff flag=01 or 10) indicating the difference between the two block data and table index (which is stored in the cost table corresponding to the calculated cost). For example, the distance information to the domain block consisting of $0^{th}$ and $1^{st}$ short blocks includes the distance information (distance flag=1, distance value 8) and the difference information (difference flag=01 and table index).

The coder 240 compresses the data of the range block using the distance information and difference information (difference flag and table index).

Figure 10:
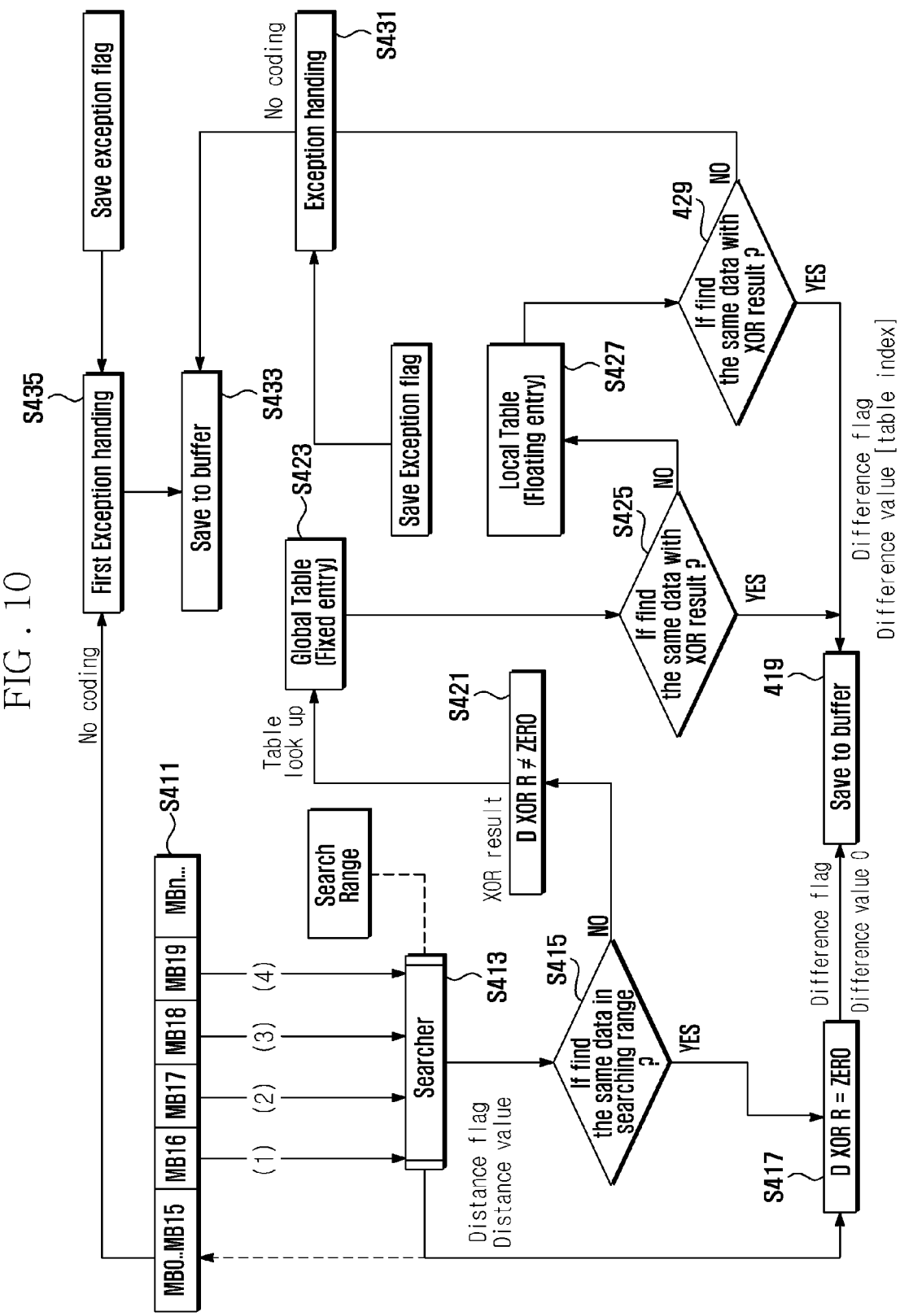
FIG. 10 is a flowchart illustrating an exemplary data compression operation of the coder of FIG. 8.

FIG. 10 is a flowchart illustrating an exemplary data compression operation of the coder 240 of FIG. 8. In FIG. 10, the data compression operation is depicted under the assumption that the coder 240 has the exception handling function. However, the coder 240 can be implemented without the exception handling function. In this case, the exception handler 250 is omitted from the structure of the compression, and the coder 240 encodes the block, which is regarded as an exception block (e.g. none of the short blocks consisting of the range block in identical with any of the short blocks in the search range), with the calculated cost.

Referring to FIG. 10, the loader 210 loads the input data in step S411 such that the input data is buffered in a buffer. At this time, the input data is partitioned into macro blocks and short blocks. The macro blocks positioned at the beginning of the loaded data are coded with reference to none or a little comparison-target macro blocks. In this case, since there are not enough domain blocks to refer to, the compression efficiency is low. Accordingly, it is preferred that a preset number of macro blocks positioned at the beginning of the coding frame should be processed without compression as exception blocks. The loader 210 loads the data in unit of coding frame, and the searcher 220 performs a searching process in units of domain blocks identical with the range block in size. At this time, the data positioned at the beginning of the coding frame has little or no referable domain block. In this case, the searcher 220 treats a preset number of macro blocks defined at the beginning of the coding frame as exception blocks. In FIG. 10, the 16 macro blocks MB0 to MB15 are assumed to be exception blocks. Once the data compression starts, the coder 240 performs exception handling on the macro blocks MB0 to MB15 in step S435 and saves the exception blocks MB0 to MB15 to a buffer in step S433. At this time, the exception blocks are stored without compression.

After processing the initial exception blocks, the searcher 220 configures the search range as shown in FIG. 9, loads a range blocks and domain blocks in the search range, compares the range block with the domain blocks, and sends distance information and difference information associated with the range block to the coder 240 in step S413.

The coder 240 evaluates the difference flag and determines whether the data of the range block is identical with the data of domain range (cost=0) in step S415. If the data of the range block and domain block are identical with each other, the coder 240 encodes the distance information and difference flag as the compressed data of the range block in step S417 and saves the compressed data in the memory in step S419. That is, if the data of the range block and domain block are identical with each other, the coder 240 creates the distance information between the range block and domain block and difference flag (diff flag=00) indicating the sameness of the data between two blocks as the compressed data of the range block.

If it is determined that there is no domain block of which data are identical with the range block (diff flag≠0) at step S415, the coder 240 evaluates the table index in step S421 and looks up the table index in the table in step S423. The table index is generated by the searcher 220 on the basis of the difference value between two blocks. The table index can be a global table index (and/or the local table index). The table index is checked for determining whether the cost found by the searcher 220 exists in the global table (and/or local table). The global table (and/or local table) uses the table index determined by the cost and allows a decompressor to extract the difference value between the range block and domain block with reference to the data index when decompressing the data. In the following description, it is assumed that both the global and local tables are used. The compressed data of the range block can be recovered to the original data by using the table index generated by the searcher 220 as the index of the table. At this time, if the difference flag indicates a global table index (difference flag=01), the coder 240 determines whether the table index value exists in the global table in step S425. If the difference flag exists in the global table, the coder saves the distance information and difference information in the memory in step S419. At this time, the distance information may include a distance flag of the range block and a distance value to the domain block, and the difference information may include a difference flag and an index value of the global table. If the difference flag indicates the index of a local table (diff flag=10), the coder 240 looks up the local table in step S427. Here, the local table is created by the searcher 220 as shown in FIG. 7B to register the difference value appearing more frequently than a preset number of times but not registered in the global table. At this time, if the table index value exists in the local table, the coder 240 detects the existence of the table index value in step S429 and stores the distance information and difference information in the memory in step S419. If the difference flag is set to "01" or "10" rather than "00", the coder 240 stores the difference information including the difference flag value and a table index of global or local table and the distance information in the memory.

If it is determined, at step S429, that the difference flag is an exception flag, the coder 240 activates the exception handler 250 in step S431. The exception handler 250 stores the exception flag within the memory at step S431 and stores the data of the range block without compression in step S433. That is, if the range block is not identical with the domain block in the search range, or the index does not exist in the global and local tables, the coder 240 stores the exception flag and the data of the range block without compression.

As describe above, the coder 240 can store the data of the range block in the memory without compression. For example, the data of the short blocks belonging to the range block differ from the data of the short blocks of the domain block or the cost is high even though there exist the same data in the two blocks, the coder 240 performs exception handling on the range block. That is, if the difference value between the range block and the domain block does not exist in the global and local tables, the coder 240 stores the data of the range block without compression. In this case, the coder 240 notifies the exception handler 250 of the exception block such that the exception handler 250 stores the data of the range block in the memory without compression. Here, the exception handler 250 can be integrated into the coder 240.

While compressing the data of the loaded range blocks, the compressor stores the compressed data in the memory. At this time, the compressed data includes distance information, difference information, and exception block. The compressed data are stored as table 2.

TABLE 2

| Memory | Description |
| --- | --- |
| Distance information | If distance flag = 1, store distance value to domain block.<br>If distance flag = 0, store no distance value. |
| Difference information | If difference flag = 00, store only difference flag with no table index.<br>If difference flag = 01, store difference flag and global table index as difference information.<br>If difference flag = 10, store difference flag and local table index as difference information. |
| Exception block | If difference flag = 11, handle as exception block, store difference flag as difference information, and store range block data without compression. |

As described above, the compressor calculates difference values by comparing the domain blocks positioned prior to the range block with the range block, calculates costs from the difference values, and compresses the data of the range block using the distance information and difference information to the domain block having the least cost. Since the difference value between the range block and the third domain block [4,5] is zero in FIG. 9, the coder 240 generates the distance and difference value to the third domain block a the compressed data.

However, in a case that the domain blocks, such as the first [6,7] and fifth [2,3] domain blocks in FIG. 9, has no short block identical with those of the range block, the coder 240 handles the range block as an exception block.

Like the second [5,6], fourth [3,4], sixth [1,2], and seventh [0,1] domain blocks, if one short block of the domain block is identical with the corresponding short block of the range block, the coder 240 calculates the sum of costs of the domain blocks in the search range to the range block and determines the distance and difference information (difference flag and table index) between the range block and domain block having the least cost sum as the compression data. When the coder 240 has the global table and/or local table, the coder 240 replaces the difference value with a table index and determines the information linked to the index as the compressed data. In this case, the compressed data of the range block can be represented by the distance to the domain block and the information of the table.

Figure 11:
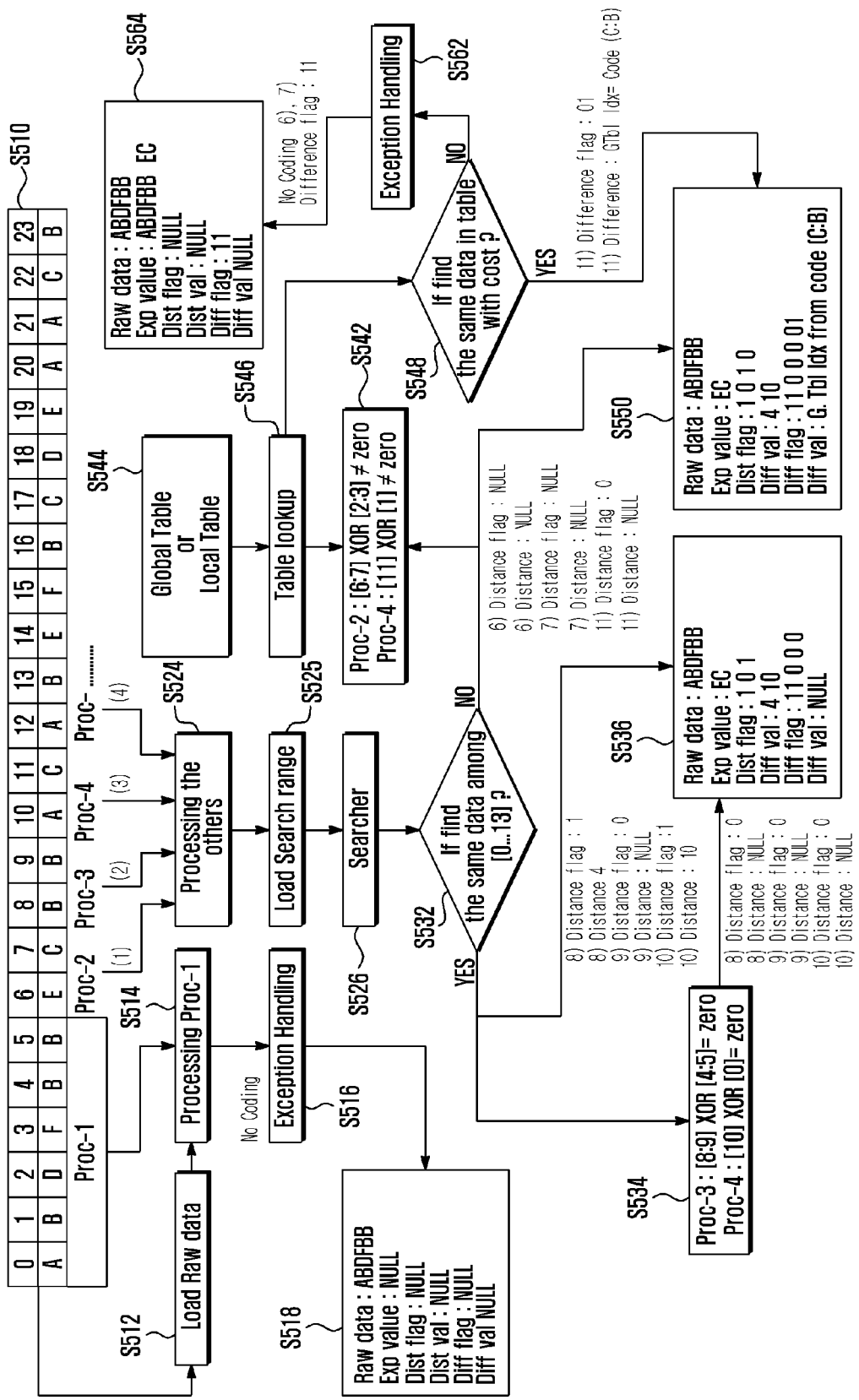
FIG. 11 is a flowchart illustrating a data compression operation of the coder according to an exemplary embodiment of the present invention.

FIG. 11 is a flowchart illustrating a data compression operation of the coder according to an exemplary embodiment of the present invention. When the input data loaded by the loader 210 is buffered in the buffer, the searcher 220 calculates the cost of the domain block having the least value in association with the range block as shown in FIG. 9. In this case, the coder 240 encodes the data of the range block using the distance information and difference information output by the searcher 220. In FIG. 11, such data coding procedure is described in more detail, Referring to FIG. 11, the operations of the searcher 220 and coder 240 are described in more detail with an exemplary case that the short blocks [0, 1, 2, 3, 4, 5] (proc-1) are exception blocks and the blocks [6,7](proc-2), [8,9](proc-1), [10,11] (proc-1) are range blocks.

First, the loader 210 loads a coding frame such that the data of the coding frame is buffered in an internal buffer in step S510. Next, the coder 240 loads the data of the exception blocks in step S512 and performs exception handling on the data of the exception blocks in steps S514 and S516. Here, the exception blocks are 6 short blocks (3 macro blocks) of [0,1,2,3,4,5]. The blocks that are exceptionally processed at step S516 are stored in the memory in step S518. The reason why a preset number of macro blocks of the coding frame are processed as exception blocks is low compression ratio thereof. In this case, it is preferred that the exception blocks are the macro blocks positioned at the beginning of the coding frame. The data of the macro blocks processed through exception handling process are stored in raw data format.

After processing the exception blocks, the compressor selects a range block from a sequence of macro blocks, inspects the domain blocks positioned prior to the range block to obtain the distance information and difference information, and compresses the range block on the basis of the distance and difference information. The compression procedure is described with an exemplary case that the macro blocks proc-2[6,7], proc-3[8,9], and proc-4[10,11] are selected as range blocks.

Regarding the compression process of proc-2[67], the searcher 220 loads the range block [6,7] in step S524 and configures a search range in step S525. Here, the search range is defined by the blocks [0-5]. Next, the searcher 220 performs forward and backward coding on the domain blocks in the search range in step S526. Since no same block exists in the search range, the searcher 220 does not generate the global and local table index but difference flag set to "11 (i.e. exception handling flag) for processing the range block as an exception block. Accordingly, the coder 240 performs exception handling on the range block [6,7] with reference to the exception handling flag at step S562. While processing the exception block, the coder 240 stores the difference flag set to 11 indicating the exception block together with the data of the exception block without compression. At this time, the data of the exception block is stored in the form of the table referred to as reference numeral S564 in FIG. 11.

Regarding the compression process of proc-3[8,9], the searcher 220 loads the range block [8,9] in step S524) and configures a search range in step S525. Here, the search range is defined by the blocks [0-7]. Next, the searcher 220 performs forward and backward coding on the domain blocks in the search range in step S526. The searcher 220 detects that the domain block [4,5] is identical with the range block [8,9] and thus generates difference information having difference value set to 0. In this case, the searcher 220 generates distance information on the short block [8] with distance flag=1 and distance value=4 and distance information on the short block [9] with distance flag=0 and difference flag=0 (since the distance between short blocks [9] and [5] is identical with the distance between the short blocks [8] and [4]) and outputs the distance and difference information to the coder 240. The coder 240 determines the identification of the range block and the domain block and stores the compression data composed of the distance information (flag=10, distance value=4) and distance flag (difference flag=0, 0) within the memory in steps S532 and S534. At this time, the compressed data of the block [8,9] is stored in the form of the table referred to as reference numeral S536 in FIG. 11 (10 [distance flag], 4 [distance value], 00 [difference flag]).

Regarding the compression process of proc-4[10,11], the searcher 220 loads the range block [10,11] in step S524 and configures a search range in step S525. Here, the search range is defined by the blocks [0-9]. Next, the searcher 220 performs forward and backward coding on the domain blocks in the search range in step S526. While performing the forward and backward coding, the searcher 220 detects the similarity between the domain block [0,1] and the range block [10,11] and generates difference information and distance information. Since the short block [10] of the range block and the short block [0] of the domain block are identical with each other, the searcher 220 generates the difference information with the difference value set to 0. In this case, the searcher 220 generates the distance information including a distance flag set to 1 and distance value set to 10 and the difference information including the difference flag set to 0 and outputs the distance and difference information to the coder 240. Also, since the short block [11] of the range block and the short block [1] are different from each other, the searcher 220 calculates the difference value [C XOR B] of the two short blocks and cost corresponding to the difference value. Next, the searcher 220 determines a table index corresponding to the cost with reference to the cost table. In this case, the searcher 220 generates a distance flag set to 0 (since the distance between the short blocks [11] and [1] is identical with the distance between the short blocks [10] and [0]) and outputs the difference information including the difference flag and the selected table index to the coder 240. Here, the difference information may include the difference flag set to 01 and global table index (Gtbl idx).

The coder 240 determines the identification of the short block [10] of the range block and the short block [0] of the domain block and stores the compression data composed of the distance information (distance flag=1, distance value=10) and the difference information (different flag=0) in the memory. Since the short block [11] of the range block and the short block [1] of the domain block differ from each other, the coder 240 looks up the table index in step S546 output by the searcher 220 in the table referred to as reference numeral S544 in steps S542 and S544. At this time, if the table index output by the searcher 220 is found in the table (global table or local table) in step S548, the coder 240 stores the cost [Gtbl idx=code (C:B)] as a difference value. That is, the coder 240 stores the distance information including the distance flag set to 0 and the difference information including the difference flag set to 01 and difference value set to [Gtbl idx=code (C:B)] as the compressed data of short block of the range block in the form of table referred to as reference numeral S550.

After loading the coding frame referred to as reference numeral S510, the searcher 220 and coder 240 compress the short blocks [0-11] and store the compressed data in the form of the table referred to as reference numeral S550.

As described above, an exemplary data compression method according to an exemplary embodiment of the present invention compresses a range block with reference to distance information and difference information between the range block and domain blocks in a search range. Here, the distance information includes a distance flag and distance value. The distance flag is 1 bit long and is set to indicate a setting or resetting state. That is, if the distance value between the current range block to be compressed and the domain block is identical with the distance value between the previous range block and the corresponding domain block, the distance flag is set to a reset state ("0" in table 2) and, otherwise, is set to a set state ("1" in table 2). When the distance flag is set to the set state (i.e. "1"), the distance information includes the distance flag and a distance value to the corresponding domain block.

On the other hand, when the distance flag is set to the reset state (i.e. "0"), the distance information includes only the distance flag.

Also, the difference information is the information on the difference between the range block and the corresponding domain block. The difference information may include a difference flag and a difference value. The difference flag can be set in various formats according to the difference value. That is, when the difference value is created in a single type, the difference flag can be set with 1 bit for indicating a set state or a reset state. However, when the difference value is created in at least two types, the number of bits of the difference flag is determined according to the number of types. In the exemplary embodiments of the present invention, four methods can be used. The first method uses the difference value directly. The second method uses a table index matched, in a global table, with the difference value calculated between the range block and the domain block. The third method uses a table index matched, in a global or local table, with difference value calculated between the range block and the domain block. The fourth method processes the range block of which the compression efficiency is as low as an exception block when the second and third methods are used.

In the first difference information generation method, when the distance value between the current range block and its corresponding domain block is identical with the distance value between the previous range block and its corresponding domain block, the difference flag is set to the reset state ("0") and, otherwise (i.e. two blocks differ from each other), set to a set state ("1"). Here, the difference value between the two blocks is of a value obtained by performing the exclusive OR operation on the range block and domain block. In this case, the difference value includes the difference flag and the exclusive OR value with the corresponding domain block when the difference flag is set to 1, and includes only the difference flag when the difference flag is set to 0.

In the second difference information generation method, when the distance value between the current range block and its corresponding domain block is identical with the distance value between the previous range block and its corresponding domain block, the difference flag is set to a reset state ("0") and, otherwise (i.e. two blocks differ from each other), set to a set state ("1"). Here, the difference value between the two blocks is of a cost obtained using the exclusive OR operation between the range block and the domain block. After determining a table index of a global table using the cost, the table index is set as the difference value. In this case, the difference information includes the difference flag and the table index of the global table when the difference flag is set to a set state ("1"), and includes only the difference flag when the difference flag is set to the reset state ("0"). The global table may store the difference value between the range block and domain block. At this time, the difference value can be the exclusive OR operation value between the two blocks.

In the third difference information generation method, when the distance value between the current range block and its corresponding domain block is identical with the distance value between the previous range block and its corresponding domain block, the difference flag is set to a reset state ("0") and, otherwise (i.e. two blocks differ from each other), set to a set state ("1"). Here, the difference value between the two blocks is of a cost obtained using the exclusive OR operation between the range block and the domain block. After determining a table index of a global table or local table using the cost, the table index is set as the difference value. Here, the global table may be a fixed table, and the local table is a variable table. The local table is generated using the analysis results of the difference values that are frequently appearing but do not exist in the global table, during the compression process. In this case, the compressor registers the difference value between the range block and the corresponding domain block to the local table and registers the table index of the local table to the cost table. The difference information includes the difference flag and the table index of the global table when the difference flag is set to "01", and the difference flag and the table index of the local table when the difference flag is set to "10". Also, the difference information includes only the difference flag when the difference flag is set to "00".

Regarding the fourth difference information generation method, when the difference information generation method using the global and local tables is used, the difference value between the range block and the domain block may not exist in the tables. In this case, it may be preferable not to compress the data of the range block. This is because it takes so long to decode the compressed data of such a range block. Accordingly, when the difference value between the range block and the domain block is not registered in either of the global and local tables, the range block is handled as an exception block such that the data of the range block is not compressed. In this case, the difference flag is set as an exception flag ("11") and uses the raw data of the range block.

The compressor encodes the difference information as generated above and the distance information into the compressed data of the range block. The data compressed as above is stored in the memory or transmitted through a communication part.

In order to access and process the data stored or received in the compressed format, the compressed data must be decompressed. In an exemplary implementation, the compressed data may be decompressed by a decompressor. As describe above, the compressed data can be represented by four types of difference information. Accordingly, the compressor compresses the data using any of four compression schemes such that the decompressor is configured to decompress the compressed data using a corresponding decompression scheme.

In the first decompression scheme, the decompressor determines the distance information and selects the domain block having the lowest cost. At this time, the decompressor evaluates the distance flag contained in the distance information and, if the distance flag indicates the reset state, selects the domain block positioned at the distance of the domain block selected while decompressing the previous range block. Otherwise, if the distance flag indicates the set state, the decompressor selects the domain block positioned at the distance indicated by the distance information. Next, the decompressor performs decompression on the compressed data of the range block with reference to the distance information to the selected domain block. At this time, if the difference flag contained in the distance information indicates the reset state, the decompressor recovers the data of the range block from the data of the selected domain block. Otherwise, if the difference flag indicates the set state, the decompressor recovers the data of the range block by performing an XOR operation on the difference value and the data of the selected domain block.

In the second decompression scheme, the decompressor is provided with a global table that stores difference values frequently appearing between the range blocks and domain blocks. The decompressor first evaluates the distance information of the compressed data and selects a domain block having the lowest cost. The domain block selection can be performed in the same manner as the first decompression scheme. Next, the decompressor recovers the data of the range block using the data of the selected domain block with reference to the difference information. At this time, if the difference flag contained in the difference information indicates the reset state, the decompressor recovers the data of the range block from the data of the selected domain block. Otherwise, if the difference flag indicates the set state, the decompressor recovers the data of the range block by accessing information stored in the global table indicated by the difference value (in this case, the difference value is used as the index of the global table) and performing an XOR operation on the information and the data of the selected domain block. The information stored in the global table is of the XOR value of the range block and the lowest cost.

In the third decompression scheme, the decompressor is provided with a global table (fixed table) storing the difference values appearing frequently between the range blocks and domain blocks and a local table (variable table created during the compression process) storing the difference values appearing frequently between the range block and domain blocks but not existing in the global table. In this case, the decompressor evaluates the distance information of the compressed data and selects the domain block having the lowest cost. The domain block selection can be performed in the same manner as the first decompression scheme. Next, the decompressor recovers the data of the range block using the data of the domain block with reference to the difference information. At this time, if the difference flag contained in the difference information indicates the reset state, the decompressor recovers the data of the range block from the data of the selected domain block. Otherwise, if the difference flag indicates the set state, the decompressor selects one of the global and local tables in accordance with the difference flag, retrieves information matched with the difference value (which can be an index of the global or local table) from the selected table, and recovers the data of the range block by performing an XOR operation on the data of the selected domain block and the information retrieved from the selected table. At this time, the information stored in the global and local table is of an XOR operation value which results in the lowest cost with the range block.

In the fourth decompression scheme, the decompression is performed using a global table (fixed table) storing the difference values appearing frequently between the range blocks and domain blocks and a local table (variable table created during the compression process) storing the difference values appearing frequently between the range block and domain blocks but not existing in the global table. In this case, the decompressor evaluates the distance information of the compressed data and selects the domain block having the lowest cost. The domain block selection can be performed in the same manner as the first decompression scheme. Next, the decompressor recovers the data of the range block using the data of the domain block with reference to the difference information. At this time, if the difference flag contained in the difference information indicates the reset state, the decompressor recovers the data of the range block from the data of the selected domain block. Otherwise, if the difference flag indicates the set state, the decompressor recovers the data of the range block in different manners according to the type of the difference flag. Here, if the difference flag is an exception flag, the decompressor recovers the difference value contained in the difference information as the data of the range block. That is, the difference value of the difference information having the exception flag is uncompressed data such that the data of the range block can be recovered without a decompression process. If the difference flag indicates the use of a global or local table, the decompressor extracts information matched with the difference value (which can be an index of global or local table) from the global or local table and recovers the data of the range block by performing an XOR operation on the extracted information and the data of the selected domain block. At this time, the information stored in the global and local table is an XOR operation value which results in the lowest cost with the range block.

In the following description, it is assumed that the decompressor is provided with the global and local tables and supports the exception handling function. That is, the data decompression method is described in association with the fourth decompression scheme.

Figure 12:
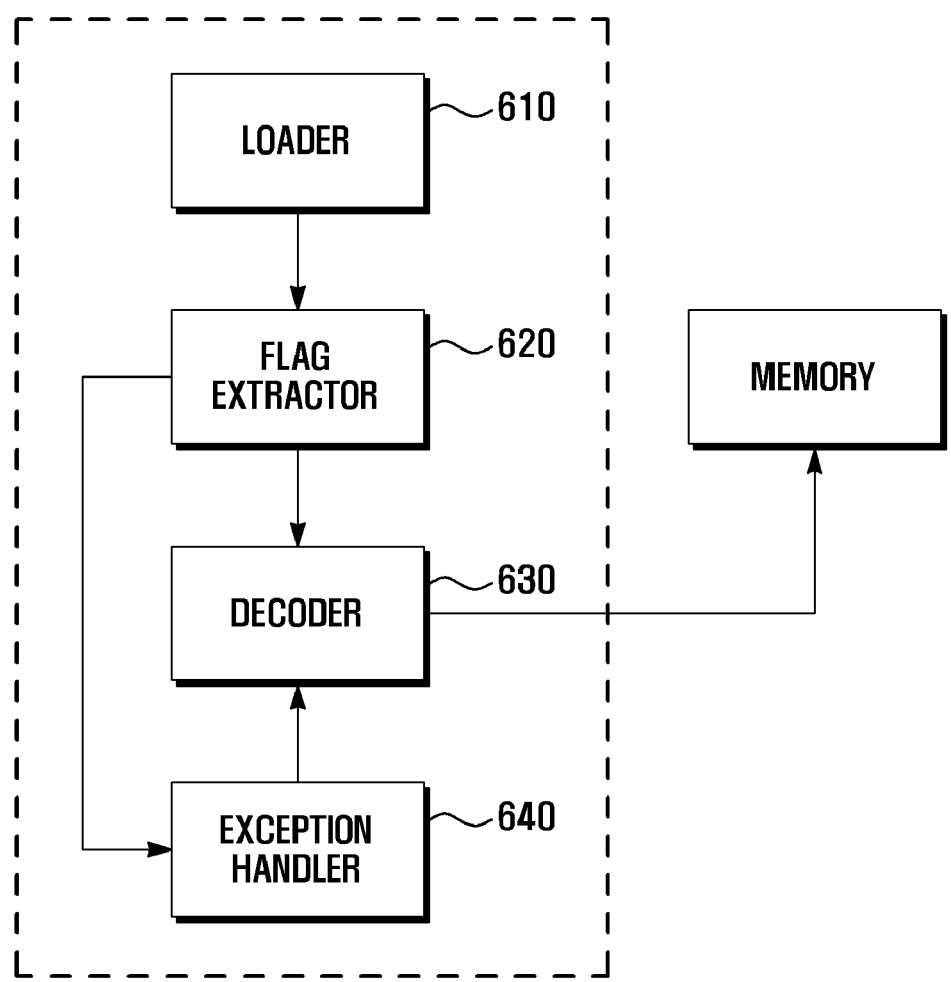
FIG. 12 is a block diagram illustrating a decompressor according to an exemplary embodiment of the present invention.

FIG. 12 is a block diagram illustrating a decompressor according to an exemplary embodiment of the present invention.

Referring to FIG. 12, the decompressor includes a loader 610, a flag extractor 620, a decoder 630, and an exception handler 640. The loader 610 loads the compressed data stored in the memory. The compressed data may include distance information, difference information, and an exception block. At this time, the distance information includes a distance flag and a distance value, and the difference information includes a difference flag and a table index. The flag extractor 620 extracts the distance flag and difference flag from the respective distance and difference information and outputs the distance and difference flags to the decoder 630. The decoder 630 analyzes the distance flag and distance value, determines the position of the domain block corresponding to the range block, determines the difference value between the range block and the domain block with reference to the distance flag and table index value, and recovers the data of the range block by performing an XOR operation on the difference value and the domain block. If the flag extractor 620 extracts a difference flag set to 11, i.e. the exception flag (difference flag indicating the exception block), the decoder 630 activates the exception handler 640 to process the data of the exception block. In this case, the exception handler 640 outputs the stored data as it is. Although the exception handler 640 is implemented as a separate component in FIG. 12, it can be integrated into the decoder 630. Furthermore, the decompressed data may be buffered in a buffer.

Although the exception handler 640 is depicted as a part of the decompressor in FIG. 12, the decompressor can be implemented without the exception handler. In a case that the compressor performs exception block handling, the decompressor may be implemented without the exceptional handler.

Figure 13:
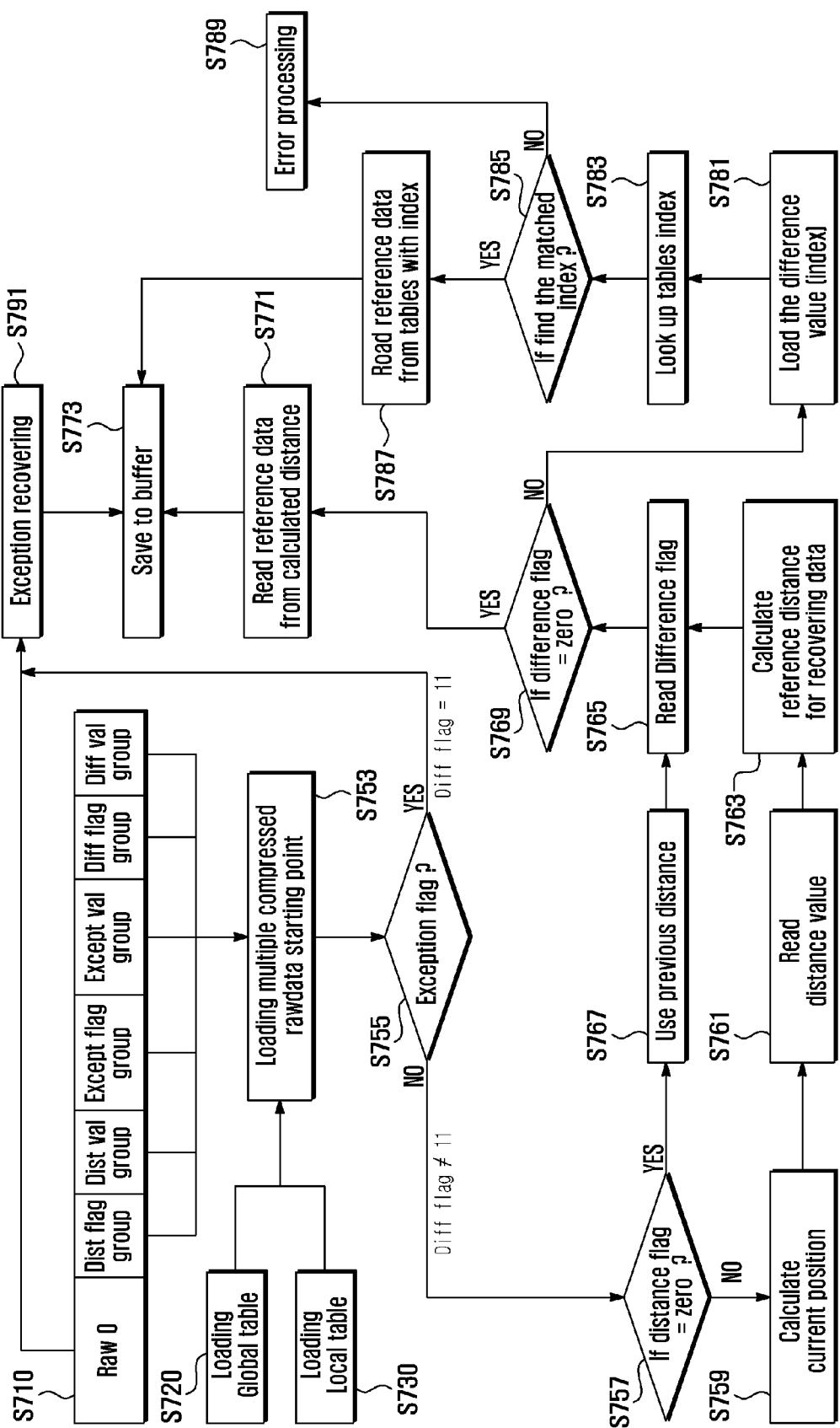
FIG. 13 is a flowchart illustrating an operation of a decompressor according to an exemplary embodiment of the present invention.

FIG. 13 is a flowchart illustrating an operation of a decompressor according to an exemplary embodiment of the present invention.

Referring to FIG. 13, the compressed data is loaded from the memory in units of a coding frame including a number of exception blocks at its beginning part in step S710. Accordingly, the decoder 630 activates the exception handler 640 to recover the data of the exception blocks in step S791. The recovered data of the exception block are saved in a buffer in step S773. Next, the decoder 630 decodes the compressed data following the exception blocks to recover the original data. In order to decompress the compressed data, the decompressor analyzes the distance information extracted from the compressed data and determines the position of the domain block on the basis of the distance information, retrieves a table index value from the table, and recovers the data of the range block using the table index value. Also, the decompressor determines the position of the exception block and inserts the data of the exception block at the position such that the data of the exception block is recovered.

In this exemplary embodiment, it is assumed that the data of the exception block is recovered first and then the data of the range blocks with reference to the distance and difference information of the compressed data is recovered.

The decoder 630 loads the global and local tables used in the compression process in steps S720 and S730 and finds the starting point of the coding frame loaded by the loader 610 in step S753. Next, the decoder 630 determines when an exception flag (difference flag=11) is detected in step S755. If an exception flag is detected, the decoder recovers the data of the exception block in step S791 and saves the data of the exception block to a buffer in step S773.

On the other hand, if no exception flag is detected (difference flag≠11), the decoder 630 accesses the distance information and determines whether the distance flag contained in the distance information indicates the set state (distance flag=0) in step S757. If the distance flag indicates the set state, the decoder 630 selects the domain block positioned at a distance indicated by the distance value. Otherwise, if the distance flag indicates the reset state, the decoder 630 does not move the position since the reset state means that the distance is identical with that of the previously processed domain block. When the distance flag indicates the set state, the decoder 630 determines the position of the range block in step S759, reads the distance value contained in the distance information in step S761, and selects the domain block positioned at the distance from the range block in step S763. On the other hand, if the distance flag indicates the reset state, the decoder 630 selects the domain block positioned at the distance of the distance value between the previously recovered range block and domain block in step S767. That is, the decoder 630 selects a reference domain block positioned at the distance, from the current range block, indicated by the distance value when the distance flag is set to 1, and selects a reference domain block while maintaining the previous distance when the distance flag is set to 0.

After selecting the domain block with reference to the distance information, the decoder 630 reads the difference flag of the difference information in step S765 and determines the state of the difference flag in step S769. If the difference flag indicates the reset state (difference flag=00), the decoder 630 copies the data of the selected domain block as the data of the range block in step S771 and saves the copied data in the buffer in step S773. The reset state of the difference flag means that the data of the range block and the selected domain block are identical with each other such that the decoder 630 decodes the data of the selected domain block into the data of the range block.

If the difference flag indicates the set state (difference flag=01 or 10), the decoder 630 reads the difference value contained in the difference information in step S781. At this time, the difference value is a table index of the global table or the local table. Accordingly, the decoder 630 loads the difference value as an index of the table in step S781 and looks up the tables in step S783. At this time, the decoder 630 retrieves the index from the table. If the difference flag is of a global table (difference flag=01), the decoder selects a difference value corresponding to the index in the global table. On the other hand, if the difference flag is of local table (difference flag=10), the decoder selects the difference value corresponding to the index in the local table.

The decoder determines whether the matching index exists in the selected table in step S785. If a matching index exists in the table, the decoder 630 reads the reference data indicated by the index from the table in step S787 and saves the read data in the buffer in step S773. Otherwise, if no matching index exists in the table, the decoder 630 performs an error handling process in step S789. As described above, when the difference flag is of a table index (i.e. the difference information indicating a table), the decoder 630 reads the data indicated by the index contained in the difference information and compares the index with the domain block (XOR operation) to recover the data of the range block.

While repeating the above process, the decoder 630 decodes the data of the range block compressed with the distance information and difference information. The data of the range block is recovered by selecting a reference domain block to the range block with reference to the distance information and processing the data of the selected domain block with reference to the difference information.

Figure 14:
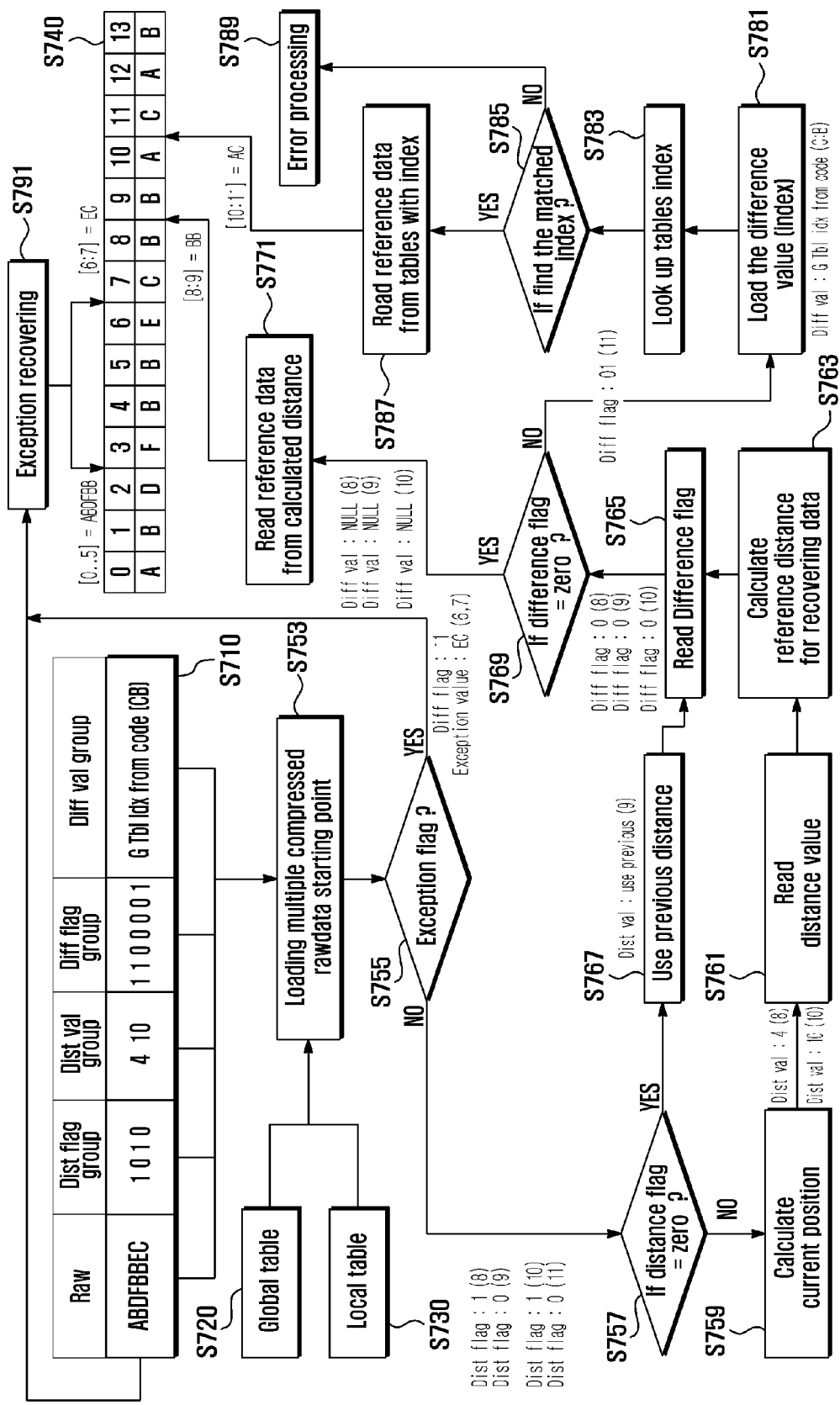
FIG. 14 is a flowchart illustrating an exemplary operation of a decompressor for decompressing the data compressed through the compression procedure of FIG. 11.

FIG. 14 is a flowchart illustrating an exemplary operation of a decompressor for decompressing the data compressed through the compression procedure of FIG. 11.

Referring to FIG. 14, the data referred to as reference numeral S510 is compressed as in FIG. 11 and stored in a compressed format referred to as reference numeral S710. Here, the data stored in the memory includes exception block information and data of an exception block and distance and difference information. In FIG. 14, the coded data frame includes the data of exception blocks positioned at the beginning and the distance information (distance flag and distance value) and difference information (difference flag and difference value) following the exception block data.

The loader 610 first loads the global and local table in steps S720 and S730. After the tables are loaded, the decoder 630 reads the data of the exception blocks (here, short blocks [0-5]) from the memory and saves the read data in the buffer in step S791. Next, the decoder 630 decodes the data with reference to the flag extracted by the flag extractor 620. After loading the tables and the compressed data in step S753, the decoder 630 determines whether the difference flag is an exception flag in step S755. If the difference flag is the exception flag (difference flag=11), the decoder 630 determines the position of the exception block (here, short blocks [6,7]) and saves the data [E,C] of the exception block in the buffer in step S791, wherein the data [E,C] of the exception block is referred to as reference numeral S740.

If the difference flag is not the exception flag, the decoder 630 determines whether the distance flag indicates the set state in step S757. If the distance flag indicates the set state (distance flag=1), the decoder 630 calculates the position of the data to be decompressed (here, the short block [8]) in step S759, reads the distance value (distance value=4) in step S761, and calculates the position of the reference domain block with reference to the distance value (the domain block positioned prior to 4 blocks) in step S763. Next, the decoder 630 reads the difference flag in step S765 and determines whether the difference flag is set to 0 in step S769. If the difference flag is set to 0, the decoder 630 reads the data of the reference domain block (here, 8$^{th}$ short block) and recovers the data as the data B of the 4$^{th}$ short block in step S771, and saves the recovered data in the buffer referred to as reference numeral S740.

The decoder 630 checks the next distance flag and determines whether the distance flag indicates a reset state at step S757. If the distance flag indicates the reset state, the decoder 630 uses the previous distance value (distance value=4) in step S767 and calculates the position of the reference domain block (5$^{th}$ short block positioned prior to 4 short blocks from the 9$^{th}$ short block) in step S765. Next, the decoder 630 evaluates the difference flag and determines whether the difference flag is set to 0 in step S769. Since the difference flag is set to 0, the decoder 630 recovers the data B of the 5$^{th}$ domain block as the data of the 9$^{th}$ short block in step S771 and saves the data in the buffer referred to as reference numeral S740.

The decoder 630 determines the next distance flag in step S757. If the distance flag is set to 1, the decoder 630 calculates the position of the range block to be decompressed (here, the 10$^{th}$ short block) in step S759, reads the distance value to calculate the position of the reference domain block (here, 0$^{th}$ short block positioned prior to 10 short blocks from the 10$^{th}$ short block in step S763. Next, the decoder 630 checks the difference flag in step S769. Since the difference flag is set to 0, the decoder 630 recovers the data of the 10$^{th}$ short block with the data A of the 0$^{th}$ short block in step S771 and saves the recovered data in the buffer referred to as reference numeral S740.

The decoder 630 checks the next distance flag in step S757. If the distance flag is set to 0, the decoder 630 reads the previous distance value (distance value=10) in step S767 and calculates the position of the reference domain block using the previous distance value (the 1$^{st}$ short block positioned prior to 10 short blocks from the 11$^{th}$ short block) in step S765. Next, the decoder 630 inspects the difference flag in step S769. Since the difference flag is set to 01, the decoder 630 loads the difference value [g.tbl idx from code (C:B)] from the memory in step S781. Next, the decoder 630 selects the data (C XOR B) indicated by the difference value from the global table in step S783, performs an XOR operation on the data and the data of the selected domain block (B of the 1st short block) ((C XOR B) XOR B=C) through steps S785 and S787, and saves the recovered data C in the buffer referred to as reference numeral S740. Otherwise, if no matching index is found to exist in step S785, the decoder 630 performs an error handling process in step S789.

As described above, the decompressor recovers the data compressed by the compressor and stores the recovered original data in the memory. In a memory device, the data are stored in a compressed format and read out after being decompressed to be used. Accordingly, the loaded data are compressed and then stored by the compressor within the memory in the writing mode, and the compressed data is decompressed by the decompressor in the reading mode, regardless of the controller of the host device, resulting in improvement of memory utilization.

Figure 15:
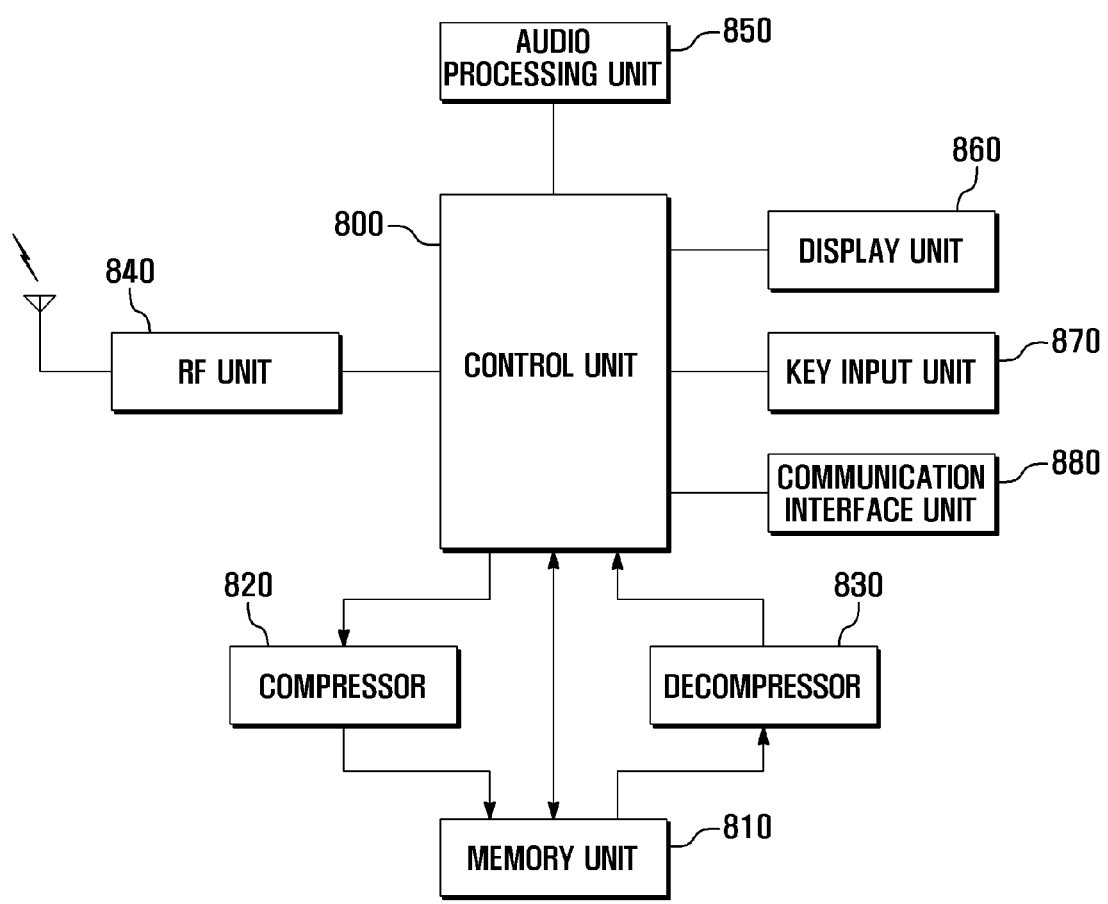
FIG. 15 is a block diagram illustrating a configuration of a mobile terminal implemented with a data compression/decompression apparatus according to an exemplary embodiment of the present invention.

FIG. 15 is a block diagram illustrating a configuration of a mobile terminal implemented with a data compression/decompression apparatus according to an exemplary embodiment of the present invention.

Referring to FIG. 15, the mobile terminal includes a control unit 800, a memory unit 810, a compressor 820, a decompressor 830, a Radio Frequency (RF) unit 840, an audio processing unit 850, a display unit 860, a key input unit 870, and a communication interface unit 880.

The RF unit 840 is responsible for radio communication of the mobile terminal. The RF unit 840 includes an RF transmitter for up-converting and amplifying a signal to be transmitted and an RF receiver for low noise amplifying and down-converting a signal received through an antenna. The key input unit 870 is provided with a plurality of alphanumeric keys for inputting alphanumeric data and function keys for executing various functions of the mobile terminal.

The control unit 800 controls an operation of the mobile terminal. The control unit 800 is provided with a data processing unit having a codec including a coder for encoding the transmission signal and a decoder for decoding the encoded signal and a modem including a modulator for modulating the encoded signal and outputting the modulated signal to the RF unit 840 and a modem and a demodulator for demodulating the modulated signal output by the RF unit 840.

The memory unit 810 may be provided with a program memory and a data memory. The program memory stores application programs for executing the operations and functions of the mobile terminal. The data memory stores the data generated during the operation of the application programs.

The compressor 820 compresses the loaded data and stores the compressed data in the memory unit 810, in the writing mode, under the control of the control unit 800. The decompressor 830 decompresses the data read out from the memory unit 810 in the reading mode under the control of the control unit 800. Here, the compressor 820 may be configured as illustrated in FIG. 8 and the decompressor 830 may be configured as illustrated in FIG. 12.

The display unit 860 displays an operation status and application specific information. The display unit 860 can be implemented with a Liquid Crystal Display (LCD). In this case, the display unit 860 includes an LCD controller, memory for buffering video data, and LCD devices. In an exemplary implementation, when the LCD supports a touchscreen function, the display unit 860 may provide an input function, in place of or in support of the key input unit 870. The audio processing unit 850 processes audio signals.

The communication interface unit 880 is provided with a communication interface with an external device. The communication interface unit 880 includes at least one wired or wireless communication interface. The wireless communication interface may include at least one of Bluetooth, ZigBee, Ultra Wideband (UWB), Wireless Broadband (WiBro), Wireless Fidelity (Wi-Fi) or another type of interface. The wired communication interface may also include Universal Serial Bus (USB), Recommended Standard (RS) serial communication or another type of interface. The mobile terminal communicates data with an external device through the communication interface unit 880.

In the above structured mobile terminal, the control unit 800 activates compressor 820 for compressing the data to be stored in the memory unit 810 and activates the decompressor 830 for decompressing the compressed data read out from the memory unit 810. Although the compressor 820 and decompressor 830 are illustrated as separate components, they can be integrated into the control unit 800 or the memory unit 810. The compressor 820 and decompressor 830 can be implemented as a part of a fusion memory device. The data processed in the mobile terminal includes program codes (firmware and software) and user data. At this time, because the codes are likely to be composed of repeated data, the compression and decompression method of exemplary embodiments of the present invention can improve the memory utilization.

In the writing mode, the control unit 800 loads the data to be stored on the compressor such that the compressor 820 compresses the data and writes the compressed data at a specific address of the memory unit 810. Here, the data can be received through the RF unit 840 or the communication interface unit 880. The control unit 800 controls the compressor 820 and memory unit 810 such that the received data is compressed by the compressor and stored in the memory unit 810. In the reading mode, the control unit 800 reads out the compressed data from the memory unit 810 and controls the decompressor 830 to decompress the compressed data. Here, the compressed data can be transmitted through the RF unit 840 or the communication interface unit or processed by the control unit 800.

Although exemplary embodiments of the present invention have been described in detail hereinabove, it should be clearly understood that many variations and/or modifications of the basic inventive concepts herein taught which may appear to those skilled in the present art will still fall within the spirit and scope of the present invention, as defined in the appended claims.

As described above, a memory access system using a data compressing/decompressing apparatus and method of the present invention stores data in a compressed format and outputs the data in the decompressed format regardless of the control of host device operating with the memory access system, resulting in improvement of memory utilization without increasing a processing load of the host device. Also, the data compressing/decompressing apparatus and method of the present invention encodes data efficiently so as to decrease data loading time and increases decoding speed.

What is claimed is:

1. A data compression/decompression apparatus, the apparatus comprising:
    a compressor for calculating costs of domain blocks to a range block through forward searching in a search range, for selecting the domain block having the lowest cost to the range block as a reference domain block through backward searching, for generating distance and difference information of the reference domain block, and for encoding the distance and difference information into compressed data of the range block; and
    a decompressor for finding the reference domain block on the basis of the distance and for decoding the compressed data into original data of the range block with reference to the difference information.

2. The apparatus of claim 1, wherein the compressor comprises:
    a searcher for calculating the costs of the domain blocks to the range block through a forward searching in a search range, for selecting the domain block having the lowest cost to the range block as the reference domain block through a backward searching, for generating distance and difference information of the reference domain block, the range block containing data to be compressed; and
    a coder for encoding the distance and difference information into the compressed data of the range block.

3. The apparatus of claim 2, wherein the distance information comprises a distance flag and a distance value indicating a number of blocks between the range block and the reference domain block, and the difference information comprises a difference flag and a difference value indicating a difference between the range block and the reference domain block.

4. The apparatus of claim 3, wherein the compressor calculates the difference value by performing an exclusive OR operation on the data of the range block and the reference domain block, and the decompressor recovers the data of the range block by performing exclusive OR operation on the difference value and the data of the reference domain block.

5. The apparatus of claim 4, further comprising a global table for storing difference values between domain blocks and range blocks, wherein the compressor registers the difference values between the range blocks and the domain blocks as indexes of the global table and reads out one of the indexes as the difference value of the difference information, and the decompressor reads out the difference value matched with the index of the global table and recovers the data of the range block by performing the exclusive OR operation on the difference value and the data of the reference domain block.

6. The apparatus of claim 5, wherein the compressor generates, when an index of the global table fails to be created, an exception flag and encodes the exception flag and the data of the range block into the compressed data of the range block, and the decompressor decodes, when detecting the exception flag in the difference information, the data contained in the difference information into the data of the range block.

7. The apparatus of claim 6, wherein the difference values stored in the global table comprise values obtained by performing an exclusive OR operation on the range blocks and domain blocks.

8. The apparatus of claim 6, further comprising an exception handler, wherein, when the exception flag is generated, the exception handler stores the data of the range block without encoding.

9. The apparatus of claim 3, further comprising a global table for storing difference values between the domain blocks and range blocks and a local table for storing difference values that do not exist in the global table but occur during a compression process, wherein the compressor registers the difference value between the range block and the reference domain block to at least one of the global and local table as an index, reads out the index as the difference value of the difference information, registers the difference value which does not exist in the global and local tables to the local table and further wherein the decompressor reads out the difference value matched with the index of the global table and recovers the data of the range block by performing an exclusive or operation on the difference value and the data of the reference domain block.

10. The apparatus of claim 9, wherein the compressor generates, when an index of the table fails to be created, an exception flag and encodes the exception flag and the data of the range block into the compressed data of the range block, and the decompressor decodes, when detecting the exception flag in the difference information, the data contained in the difference information into the data of the range block.

11. The apparatus of claim 10, wherein the difference values stored in the global and local tables are obtained by performing an exclusive OR operation on the range blocks and domain blocks.

12. A data compression/decompression method, the method comprising:
compressing data by calculating costs of domain blocks to a range block through forward searching in a search range, selecting the domain block having the lowest cost to the range block as a reference domain block through backward searching, generating distance and difference information of the reference domain block, and encoding the distance and difference information into compressed data of the range block; and
decompressing the compressed data by finding the reference domain block on the basis of the distance and decoding the compressed data into original data of the range block with reference to the difference information.

13. The method of claim 12, wherein the compressed data comprises the distance information including a distance value indicating a number of blocks between the range block and the reference domain block and the difference information including a difference value indicating difference between the range block and the reference domain block.

14. The method of claim 13, wherein the compressing of the data comprises registering the difference values between the range blocks and the domain blocks as indexes of a global table and reading out one of the indexes as the difference value of the difference information, and further wherein the decompressing of the compressed data comprises reading out the difference value matched with the index of the global table and recovering the data of the range block by performing the exclusive OR operation on the difference value and the data of the reference domain block.

15. The method of claim 14, wherein the compressing of the data comprises generating, when an index of the global table fails to be created, an exception flag and encoding the exception flag and the data of the range block into the compressed data of the range block, and further wherein the decompressing of the compressed data comprises decoding, when detecting the exception flag in the difference information, the data contained in the difference information into the data of the range block.

16. The method of claim 15, wherein the difference values stored in the global and local tables are obtained by performing an exclusive OR operation on the range blocks and domain blocks.

17. The method of claim 15, further comprising storing the data of the range block without encoding.

18. The method of claim 13, wherein the compressing of the data comprises registering the difference value between the range block and the reference domain block to at least one of a global and a local table as an index, reading out the index as the difference value of the difference information, registering the difference value which does not exist in the global and local tables to the local table and further wherein the decompressing of the compressed data comprises reading out the difference value matched with the index of the global table and recovering the data of the range block by performing an exclusive OR operation on the difference value and the data of the reference domain block, the global table storing difference values between the domain blocks and range blocks and the local table storing difference values that do not exist in the global table but occur during compression process.

19. The method of claim 18, wherein the compressing of the data comprises generating, when an index of the table fails to be created, an exception flag and encoding the exception flag and the data of the range block into the compressed data of the range block, and further wherein the decompressing of the compressed data comprises decoding, when detecting the exception flag in the difference information, the data contained in the difference information into the data of the range block.

20. The method of claim 19, wherein the difference values stored in the global and local tables are obtained by performing an exclusive OR operation on the range blocks and domain blocks.

21. A data processing apparatus of a mobile terminal, the apparatus comprising:
a memory;
a compressor for calculating costs of domain blocks to a range block through forward searching in a search range, for selecting the domain block having the lowest cost to the range block as a reference domain block through backward searching, for generating distance and difference information of the reference domain block, and for encoding the distance and difference information into compressed data of the range block;
a decompressor for finding the reference domain block on the basis of the distance and for decoding the compressed data into original data of the range block with reference to the difference information; and
a controller for storing, in a writing mode, the compressed data output by the compressor within the memory and for reading out, in a reading mode, the compressed data to the decompressor.

* * * * *

UNITED STATES PATENT AND TRADEMARK OFFICE
CERTIFICATE OF CORRECTION

| | | |
|---|---|---|
| PATENT NO. | : 8,004,429 B2 | Page 1 of 1 |
| APPLICATION NO. | : 12/203114 | |
| DATED | : August 23, 2011 | |
| INVENTOR(S) | : Sung Jo Oh and Young Chul Wee | |

It is certified that error appears in the above-identified patent and that said Letters Patent is hereby corrected as shown below:

Title Page;
On the face of the patent, at the end of the section identified as "(73) Assignee:", it is certified that "and Quram Co., Ltd., Suwon-si (KR)" is being added as the second assignee.

Signed and Sealed this
Sixth Day of March, 2012

David J. Kappos
*Director of the United States Patent and Trademark Office*